US007842616B2

(12) United States Patent
Ikeda et al.

(10) Patent No.: US 7,842,616 B2
(45) Date of Patent: Nov. 30, 2010

(54) METHODS FOR FABRICATING SEMICONDUCTOR STRUCTURES

(75) Inventors: Shuji Ikeda, Austin, TX (US); Jeff Wetzel, Austin, TX (US); James Beach, Austin, TX (US); Charles Stager, Austin, TX (US); Michael Gotskowski, Austin, TX (US); Andrew Collin Campbell, Austin, TX (US)

(73) Assignee: Advanced Technology Development Facility, Inc., Austin, TX (US)

( * ) Notice: Subject to any disclaimer, the term of this patent is extended or adjusted under 35 U.S.C. 154(b) by 743 days.

(21) Appl. No.: 11/625,585

(22) Filed: Jan. 22, 2007

(65) Prior Publication Data

US 2008/0176406 A1  Jul. 24, 2008

(51) Int. Cl.
H01L 21/00 (2006.01)
(52) U.S. Cl. .................. 438/703; 438/270; 438/187
(58) Field of Classification Search .............. 438/703, 438/270, 187
See application file for complete search history.

(56) References Cited

U.S. PATENT DOCUMENTS

| | | | | |
|---|---|---|---|---|
| 6,063,688 | A | 5/2000 | Doyle et al. | 438/424 |
| 6,667,237 | B1 | 12/2003 | Metzler | 438/690 |
| 6,706,597 | B2 | 3/2004 | Geusic et al. | 438/260 |
| 6,825,087 | B1* | 11/2004 | Sharp et al. | 438/296 |
| 6,967,140 | B2 | 11/2005 | Doyle | 438/282 |
| 7,190,050 | B2 | 3/2007 | King et al. | 257/622 |
| 7,265,008 | B2* | 9/2007 | King et al. | 438/197 |
| 7,285,466 | B2* | 10/2007 | Kim et al. | 438/270 |
| 7,508,031 | B2* | 3/2009 | Liu et al. | 257/331 |
| 7,605,449 | B2* | 10/2009 | Liu et al. | 257/622 |
| 2003/0219948 | A1* | 11/2003 | Kuribayashi | 438/270 |
| 2004/0191980 | A1 | 9/2004 | Rios et al. | 438/213 |
| 2006/0151830 | A1 | 7/2006 | Gonzalez | 257/330 |
| 2006/0276032 | A1 | 12/2006 | Arakawa et al. | 438/637 |

(Continued)

FOREIGN PATENT DOCUMENTS

WO   WO 2006/101695   9/2006

OTHER PUBLICATIONS

PCT International Search Report and Written Opinion, issued in International Application No. PCT/US2007/060865, dated Jan. 17, 2008.

(Continued)

*Primary Examiner*—Laura M Menz
(74) *Attorney, Agent, or Firm*—Fulbright & Jaworski L.L.P.

(57) ABSTRACT

Methods for fabricating semiconductor structures are provided. A first layer may be deposited onto a substrate followed by the deposition of a second layer onto the first layer. A plurality of line structures may be etched in the second layer. A third layer, deposited onto the plurality of line structures of the second layer, may subsequently be etched to expose the plurality of line structures in the second layer. The plurality of line structures in the second layer may be removed, leaving an etched third layer. The etched third layer may be used as a mask to etch the first layer to form a semiconductor structure in the first layer. In some respects, the methods may include steps for etching the substrate using the etched first layer. The methods may also provide annealing the etched substrate to form a corrugate substrate surface.

1 Claim, 30 Drawing Sheets

U.S. PATENT DOCUMENTS

| | | | |
|---|---|---|---|
| 2007/0001237 A1 | 1/2007 | King et al. | 257/401 |
| 2007/0004113 A1 | 1/2007 | King et al. | 438/197 |
| 2007/0120156 A1* | 5/2007 | Liu et al. | 257/288 |
| 2007/0122953 A1* | 5/2007 | Liu et al. | 438/187 |
| 2007/0122954 A1* | 5/2007 | Liu et al. | 438/187 |
| 2007/0128782 A1* | 6/2007 | Liu et al. | 438/187 |
| 2008/0176406 A1* | 7/2008 | Ikeda et al. | 438/703 |
| 2009/0269916 A1* | 10/2009 | Kang et al. | 438/587 |
| 2009/0269918 A1* | 10/2009 | Ma et al. | 438/591 |

OTHER PUBLICATIONS

Kuribayashi et al., "Hydrogen pressure dependence of trench corner rounding during hydrogen annealing," *J. Vac. Sci. Technol.*, 22:1406-1409, 2004.

Nasrullah et al., "An edge-defined nano-lithography technique suitable for low thermal budget process and 3-D stackable devices," *2003 Third iEEE Conference on Nanotechnology, Proceedings*, 2:502-505, 2003.

\* cited by examiner

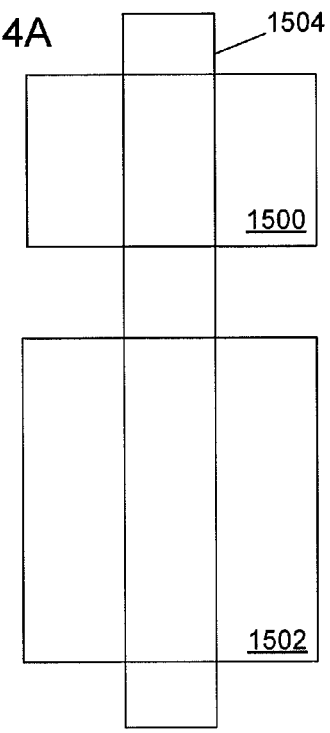
FIG. 24A
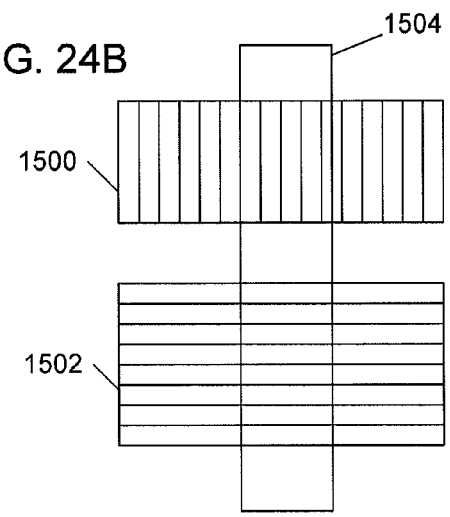
FIG. 24B
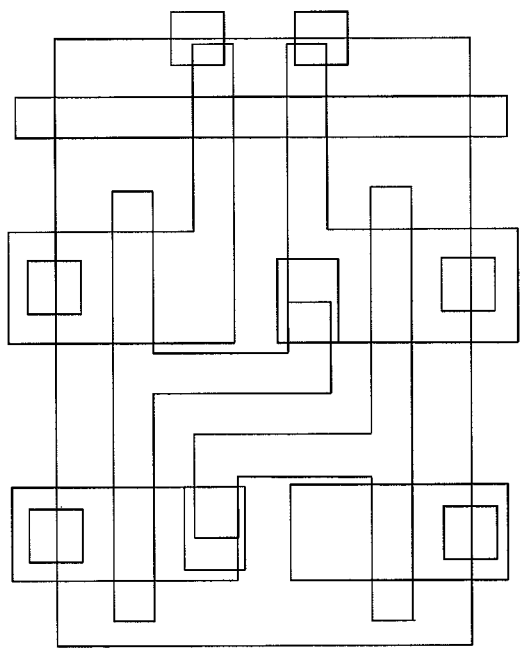
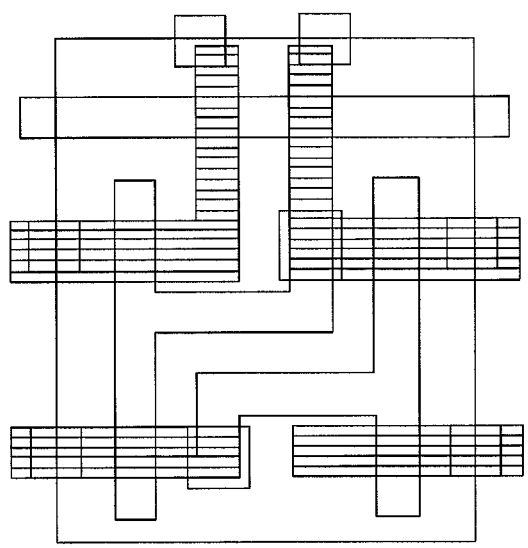
FIG. 25A
FIG. 25B

METHODS FOR FABRICATING SEMICONDUCTOR STRUCTURES

BACKGROUND OF THE INVENTION

1. Field of the Invention

The present invention relates generally to semiconductor fabrication, and more particularly to a method for defining structures using a combination of spacers and optical lithography.

2. Description of Related Art

In the field of the fabrication of semiconductor structures, for example during the production of integrated circuits based on semiconductor wafers, a large number of the devices on the wafers are fabricated using lithographic techniques. The lithographic techniques often employ masks or mask structures for the patterning and production of the semiconductor structures in subsequent process steps. The mask or mask structures are generally produced so that the patterns are true to size, in correct positions and orientation, and without defects.

Generally, an image of the pattern is projected onto a photosensitive material coating on a wafer. The image pattern may be either a positive or negative mask image that is projected onto the coated wafer using an optical lithography system. The optical lithography system emits radiation at a wavelength X which chemically changes the exposed areas of the coating, usually by polymerizing the coating exposed to the radiation. Depending on the solvent used, the unpolymerized areas are removed, and the desired pattern image remains.

However, as technology advances and device sizes become smaller, the need to resolve smaller image features becomes more difficult, especially since the diffraction limits of visible light wavelengths have been reached. In order to continue printing these features with high resolution and contrast, shorter wavelength radiation is needed. Typical optical lithography systems, such as steppers, may use radiation at wavelengths such as 365 nm, 248 nm, 193 nm, 157 nm, and 126 nm. However, only 193 nm steppers are commercially available for volume manufacturing, while steppers using 157 nm and 126 nm wavelengths are still being developed. Advanced non-optical lithography systems with shorter wavelengths such as extreme ultraviolet or soft x-rays are now being actively researched for printing complex patterns in submicron ranges. However, the problem of diffraction limited optics remains, and the drive to using shorter wavelengths provides only limited results.

In addition to shorter wavelength radiation, there are several techniques available for high resolution and contrast optical lithography. One technique developed uses phase-shifting masks to increase the resolution and contrast of optical lithography. Light rays transmitted through adjacent apertures of the mask follow different phases. However, phase-shifting masks are costly and difficult to manufacture because the phase structure must be closely related to specific geometries of the mask pattern. Moreover, as microcircuit pitches shrink in size, mask making techniques do not necessarily keep pace.

Another technique used is referred to as engineered illumination to help print smaller and smaller features of semiconductor microcircuits. This technique relies upon the use of various patterns of illumination including annular and quadrapole illumination and off-axis illumination. However, these require that the illuminator be extensively modified. Additionally, these methods and assist features are time consuming, expensive, and less efficient.

Other techniques involve advanced non-optical lithography systems such as extreme ultraviolet (EUV) lithography and e-beam (SCALPEL) lithography. However, these systems are currently being developed and are also cost-prohibitive.

Any shortcoming mentioned above is not intended to be exhaustive, but rather is among many that tends to impair the effectiveness of previously known techniques for fabricating semiconductor structures; however, shortcomings mentioned here are sufficient to demonstrate that the methodologies appearing in the art have not been satisfactory and that a significant need exists for the techniques described and claimed in this disclosure.

SUMMARY OF THE INVENTION

In one respect, the disclosure involves methods for fabricating semiconductor structures, including, but not limited to, a MOS structure, a RAM structure, a resistor, a comb structure, a bent structure, a line structure, CD changed structure, a T-structure, an electrically testable structure, and the like. The method may include providing a substrate and depositing a first layer on the substrate followed by the depositing of a second layer on the first layer. A plurality of line structures may be etched into the second layer. Next, a third layer may be deposited on the etched second layer and subsequently etched. The etching of the third layer may expose a portion of the etched second layer. The exposed portion of the second layer may subsequently be removed. The etched third layer may be used as a mask to etch the first layer to form a semiconductor structure in the first layer.

In some respects, the method may also include etching of the substrate, where the first layer may be used a mask. The substrate may subsequently be annealed, in for example, a hydrogen atmosphere, to form a corrugated substrate surface. Another material layer may be deposited on the substrate surface to form a channel of a device such as, but not limited to, a field effect transistor, a multi-gate field effect transistor, a fin field effect transistor, a tri-gate transistor, a Π transistor, a Ω transistor channel, or other suitable semiconductor devices. The channel may be perpendicular to the corrugated surface or alternatively, may be parallel to the corrugated surface.

Other features and associated advantages will become apparent with reference to the following detailed description of specific embodiments in connection with the accompanying drawings.

The term "coupled" is defined as connected, although not necessarily directly, and not necessarily mechanically.

The terms "a" and "an" are defined as one or more unless this disclosure explicitly requires otherwise.

The term "substantially," "about," and its variations are defined as being largely but not necessarily wholly what is specified as understood by one of ordinary skill in the art, and in one-non and in one non-limiting embodiment the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The figures are examples only. They do not limit the scope of the invention.

FIG. 24A is an inverter layout on a conventional substrate having a substantially planar surface, in accordance with embodiments of the present disclosure.

FIG. 24B is an inverter layout on a non-planar substrate surface, in accordance with embodiments of the present disclosure.

FIG. 25A is a SRAM cell layout on a conventional substrate having a substantially planar surface, in accordance with embodiments of the present disclosure.

FIG. 25B is a SRAM cell layout on a non-planar substrate surface, in accordance with embodiments of the present disclosure.

DESCRIPTION OF ILLUSTRATIVE EMBODIMENTS

Figure 1:
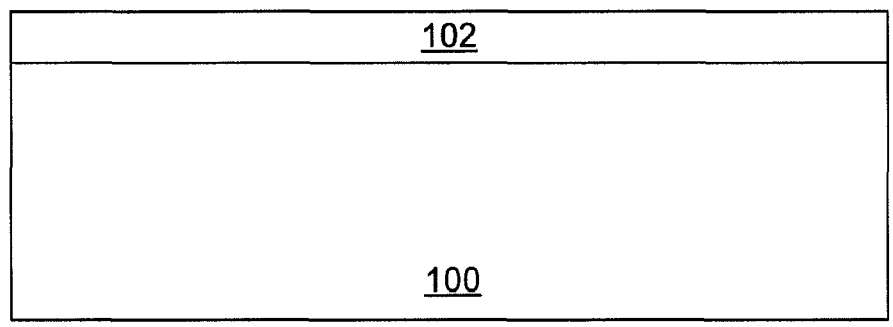
FIGS. 1 through 9 are steps for fabricating a pattern, in accordance with embodiments of the present disclosure.

The disclosure and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present disclosure provides fabrication techniques combining spacer defined patterns and optical lithography for creating semiconductor structures. In one respect, the techniques provide for patterning a range of different shapes. Alternatively or in addition to the above, the present disclosure may provide fabrication techniques for patterning layers coupled to a substrate.

For example, the techniques of the present disclosure provide for fabricating non-planar (e.g., corrugated) substrate surfaces. In some respect, the substrate surface may include, without limitation, a silicon-on-insulator (SOI) substrate, a bulk silicon substrate, a strained silicon-on-insulator (sSOI) substrate, a silicon-germanium-on-insulator (GOI) substrate, a strained silicon-germanium-on-insulator (sGeOI) substrate, or a silicon on sapphire (SoS) substrate. The non-planar feature may be created by fabricating trenches in the surface of the substrate. In some embodiments, the trenches may be at half-pitch or at quarter-pitch, allowing for varying periodicity which may change the length of the channel while minimizing the area of the device.

The term "spacer," as used and define in this disclosure, refers to a spacer material applied to polysilicon gates prior to implant in many semiconductor devices. If a conformal film is deposited onto an existing feature followed by an isotropic etch, thin residual sidewalls of the material may be added to the feature. If the original feature is subsequently selectively removed, the sidewall material remains and can be used for further processing. In this technique, smaller features may be made as compared to conventional optical lithography. Spacers may also be used to create a line/space pattern with a very small pitch by building up spacer material on both sides of a line/space pattern in a first layer and subsequently removing the first layer. This process, as defined and used in this disclosure, is referred to as "pitch doubling" because the process results in a line/space pattern that has about half the pitch of the original pattern.

Fabricating a Patterned Layer

Referring to FIGS. 1 through 9, steps of a method for defining structures using a combination of spacer and optical lithography are shown. In some respect, a patterned layer may be used as a mask for subsequent fabrication techniques to define the structures on, for example, semiconductor layers and/or substrates.

Referring to FIG. 1, first layer 102 may be deposited on substrate 100 using techniques known in the art. For example, chemical vapor depositions (CVD) methods, plasma enhanced chemical vapor deposition (PECVD) methods, physical vapor deposition (PVD) methods, and/or sputtering methods may be employed to deposit first layer 102 on substrate 100.

Figure 2:
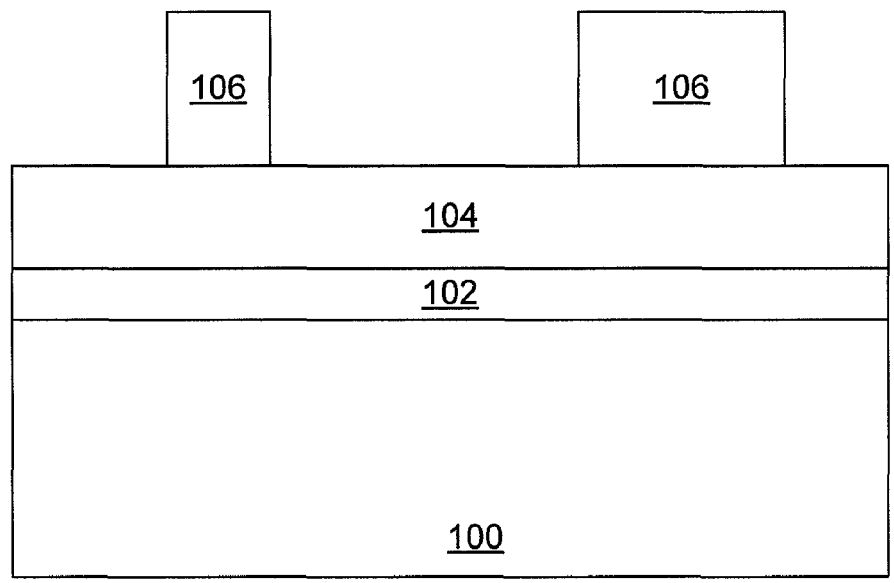

Next, in the step shown in FIG. 2, a second layer 104 may be deposited on first layer 102. In one embodiment, a number of materials may be deposited to form layers 102 and 104 depending upon the integration approach. Several of these combinations include for layer 102 ($SiO_2$, Si, SiN) with similar materials selected for layer 104 ($SiO_2$, Si, SiN). Non-limiting examples of the types materials for first layer 102, second layer 104, third layer 108, and fourth layer 110 are shown in Table 1. It is noted that other materials including, without limitation, metallic layers, insulation layers, silicon layers, and other films may be used in any combination.

TABLE 1

Examples of materials used in the fabrication of a non-planar surface

| | Layer | | | |
|---|---|---|---|---|
| Case | 102 | 104 | 108 | 110 |
| A | $SiO_2$ | SiN | Si | SiN |
| B | $SiO_2$ | Si | SiN | Si |
| C | Si | $SiO_2$ | SiN | $SiO_2$ |
| D | Si | SiN | $SiO_2$ | SiN |
| E | SiN | Si | $SiO_2$ | Si |
| F | SiN | $SiO_2$ | Si | $SiO_2$ |

Next, photoresist layer 106 may be deposited and aligned on second layer 104 and may subsequently be patterned using techniques know in the art. In one embodiment, photoresist material 106 may be etched at approximately a 1:1 line-space dimension using techniques such as exposing the photoresist through a mask with an electromagnetic radiation source at some wavelength, $\lambda$. Alternatively, photoresist layer 106 may be etched to other line-to-space dimensions that may be a 1-to-1 ratio or other ratios that are appropriate based on the end pattern design.

The electromagnetic radiation source includes, but is not limited to, ultraviolet light, infrared sources, and the like. Any portion of photoresist layer 106 that has been exposed to the light may be removed, resulting in a patterned photoresist layer, as shown in FIG. 2.

Figure 3:
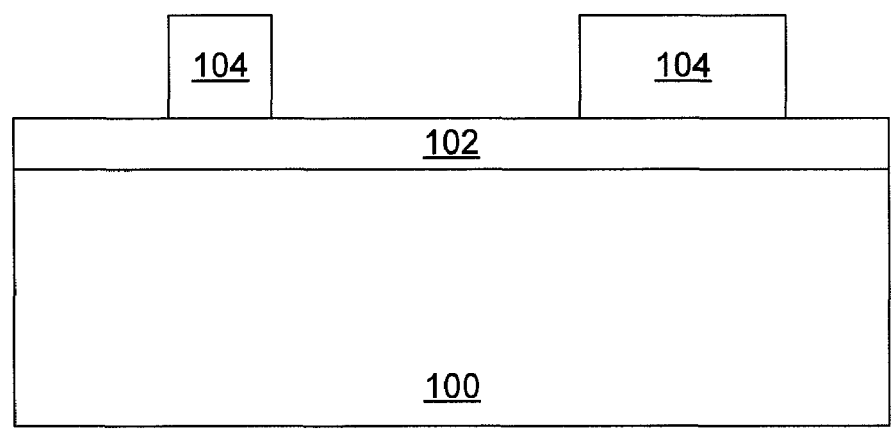
Figure 4:
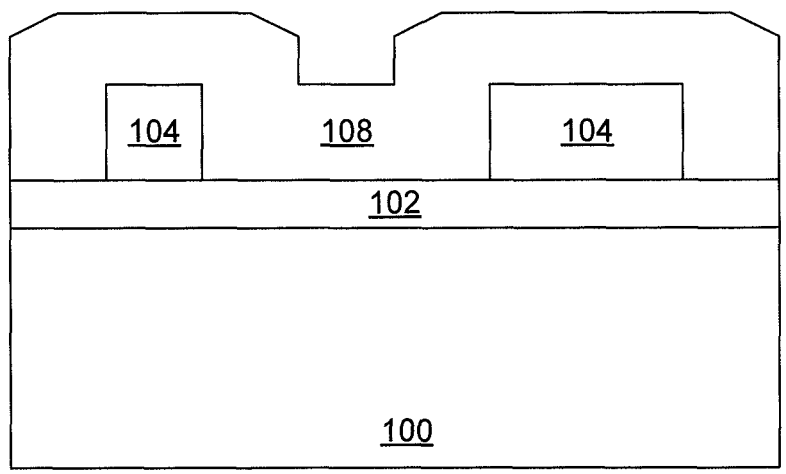

Referring to the step shown in FIG. 3, second layer 104 may be etched using techniques such as wet or dry etching methods known in the art. Next, third layer 108 may be deposited onto etched second layer 104, as seen in the step shown in FIG. 4, where the deposition may be a symmetric distribution of third layer 108 around second layer 104. In some embodiments, the thickness of third layer 108 may be controlled to a fraction of the wavelength $\lambda$, e.g., $0.5\lambda$. Alternatively, in other embodiments, third layer 108 may be conformably deposited over the top of the resulting line and space of the structure shown in FIG. 3.

Figure 5:
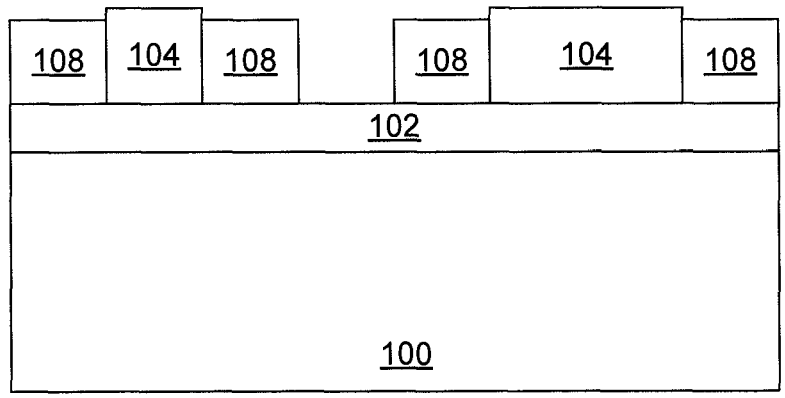

In the step shown in FIG. 5, third layer 108 may be etched using techniques known in the art. In one embodiment, the etching process may be selective to second layer 104 such that a top surface of second layer 104 is exposed. The etching step may result in individual, distinguish region of second layer 104 and third layer 108 with an open space between each distinguished region, as shown in FIG. 5.

Figure 6:
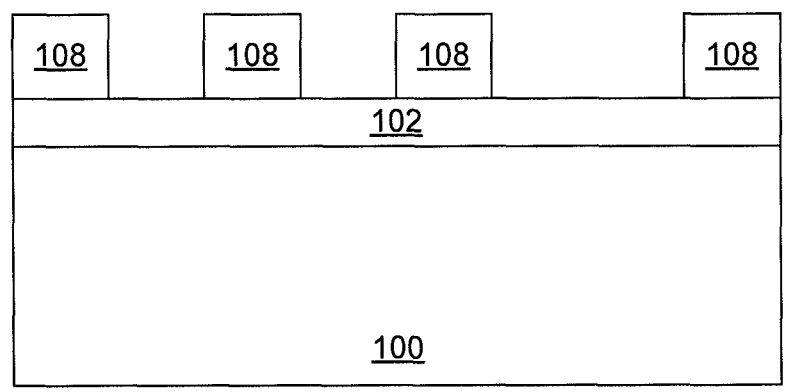

In the step shown in FIG. 6, second layer 104 may be removed. In one embodiment, second layer 104 may be removed using an etchant selective to both third layer 108 and first layer 102.

Figure 7:
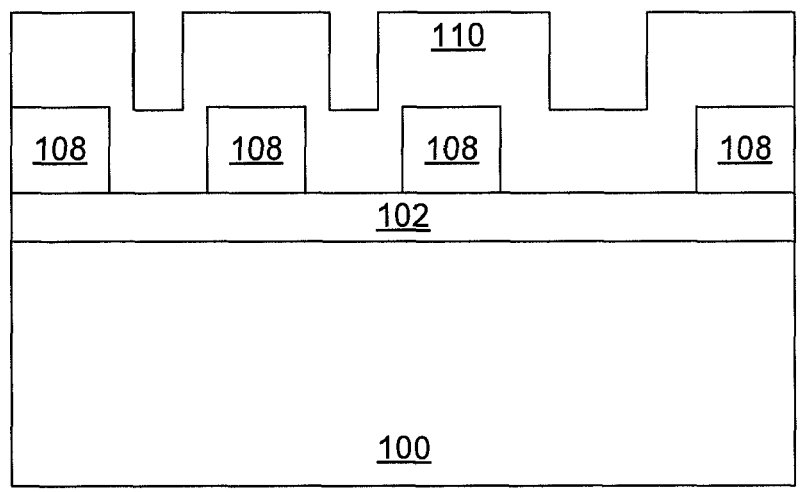

In the step shown in FIG. 7, fourth layer 110 may be deposited on the resulting structure from FIG. 6. In some respects, fourth layer 110 may be deposited on the resulting structure shown in FIG. 6 or alternatively, on a portion of the resulting structure shown in FIG. 6 (e.g., selectively masking a portion of third layer 108). In one embodiment, fourth layer 110 may be the same material as second layer 104. Referring to Table 1, some non-limiting examples are presented representing the types of materials that may be used.

Figure 8:
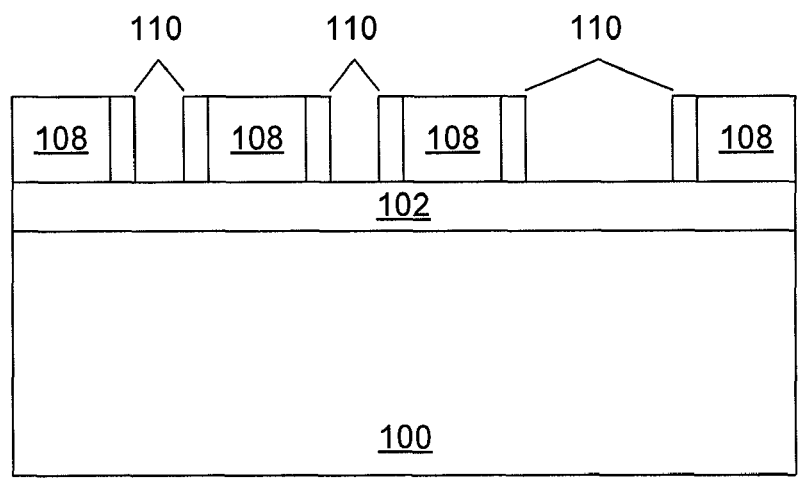
Figure 9:
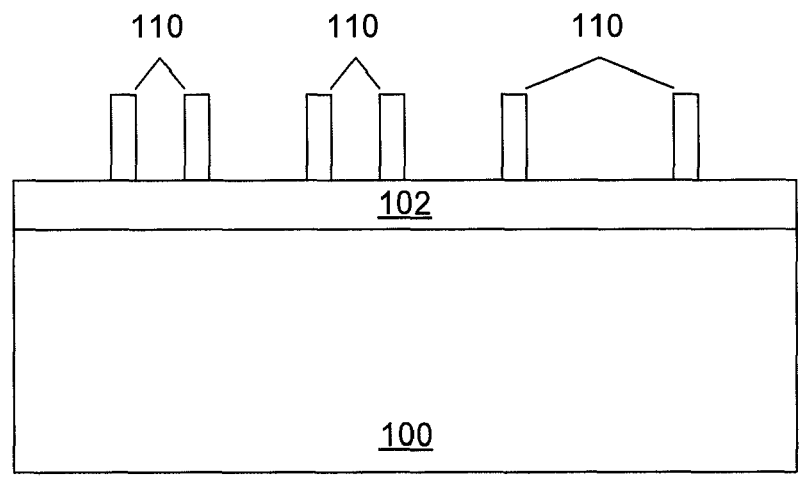

Next, an etching step using an etchant selective to third layer 108 and first layer 102 may be used to etch fourth layer 110, as shown in FIG. 8. In the step shown in FIG. 9, an etchant selective to fourth layer 110 and first layer 102 may be used to remove third layer 108. The resulting pattern, a patterning layer, shown in FIG. 9 may be used to create patterns in layers, such as, for example, first layer 102, and/or substrate 100. In some respect, etching techniques, such as wet etch, dry etch, reactive ion etch, or the like may be used to transfer the pattern to the underlying layers (e.g., layer 102 and/or substrate 100).

It is noted that some of the steps shown in FIGS. 1-9 may be optional. For example, the steps shown in FIGS. 7-9 may be optional in designs where third layer 108 does not need to be selectively masked. The resulting structure shown in FIG. 6 may be used as a mask to etch first layer 102 and/or substrate 100.

Fabricating a Corrugated Substrate

In the production micro- and nano devices, the level of device integration increases. As a result, features such as contact area, junction depth, and line spaces decrease, causing the fabrication of transistors to be more difficult. For example, for a CMOS memory device, the NMOS transistors may be fabricated with a predetermined channel length, generally shorter than conventional devices. However, short channel effects associated with the reduced size of the transistors may result in the malfunction of the NMOS transistors, and the CMOS memory device as a whole.

Figure 10:
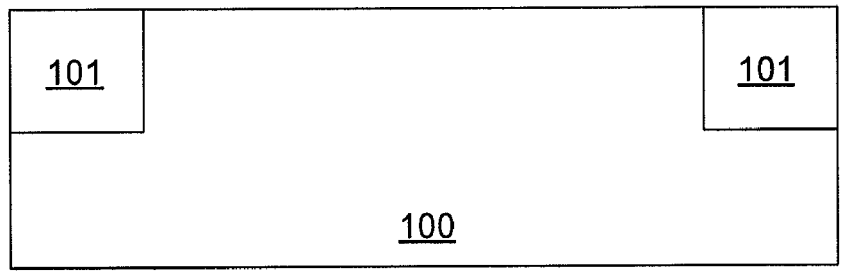
FIGS. 10 through 21 are steps for fabricating a non-planar substrate surface, in accordance with embodiments of the present disclosure.
Figure 11:
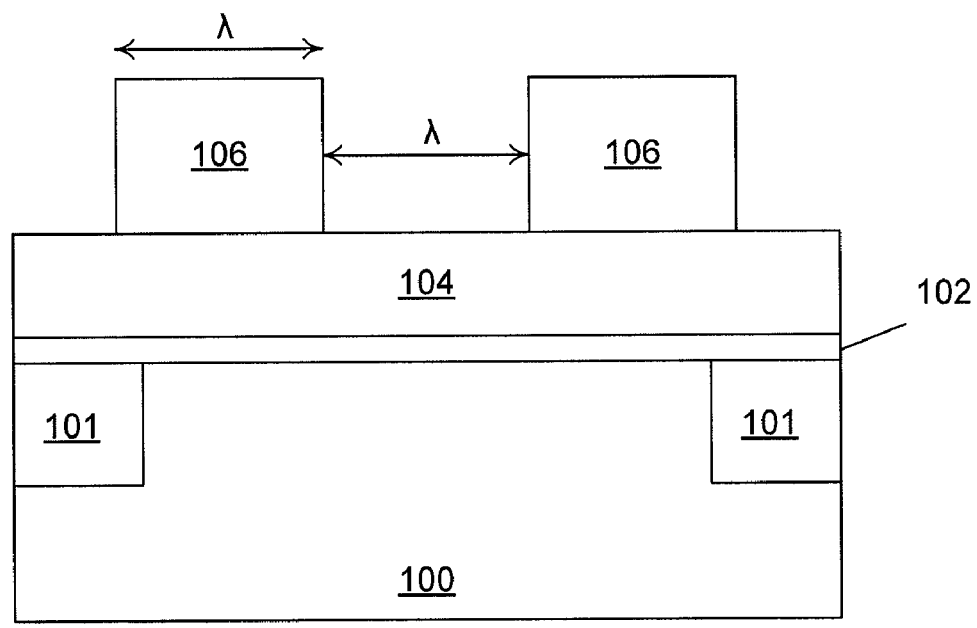

One conventional technique used to increase the channel length is to form a raised source and drain area using selective epitomical growth. An epitaxy layer can be deposited to achieve a predetermined thickness on a portion of substrate where source and drain junctions are formed. The resultant structure includes a source and drain area set higher than the substrate. The raised source and drain structure can effectively increase the channel length, thereby reducing short channel effects However, the thickness of the epitaxy layer can also influence the efficacy of the transistor. For example, if the epitaxy layer is too thick, the raised source and drain structure may cause an electrical short between the structure and a gate electrode. Similarly, if the epitaxy layer is too thin, the raised source and drain structure may not be effective enough in reducing the short channel effects The present disclosure provides a fabrication technique to create a non-planar, corrugated surface on substrate 100, using some or all the steps shown in FIGS. 1-9. In some embodiments, prior to the deposition of first layer 102, a trench isolation technique step may be performed on substrate 100, creating trenches 101, as shown in FIG. 10. The trench isolation technique may involve using an etching technique, such as reactive ion etching (RIE) to etch substrate 100. Upon etching the substrate, the trenches may be filled with, for example, a polysilicon material. Subsequent fabrication steps may also be used to create the final trench structures. For example, steps including, but not limited to oxidation of substrate 100, chemical mechanical polishing (CMP) of the surface to remove excess oxide and for creating a substantially planar substrate surface, and etching may be used to create trenches 101.

In some of the steps shown in FIGS. 10-21, certain space to line aspect ratios may be achieved. For example, referring to FIG. 11, photoresist material 106 may be etched at approximately a 1:1 line-space dimension using techniques such as exposing the photoresist through a mask with an electromagnetic radiation source at some wavelength, λ.

Figure 12:
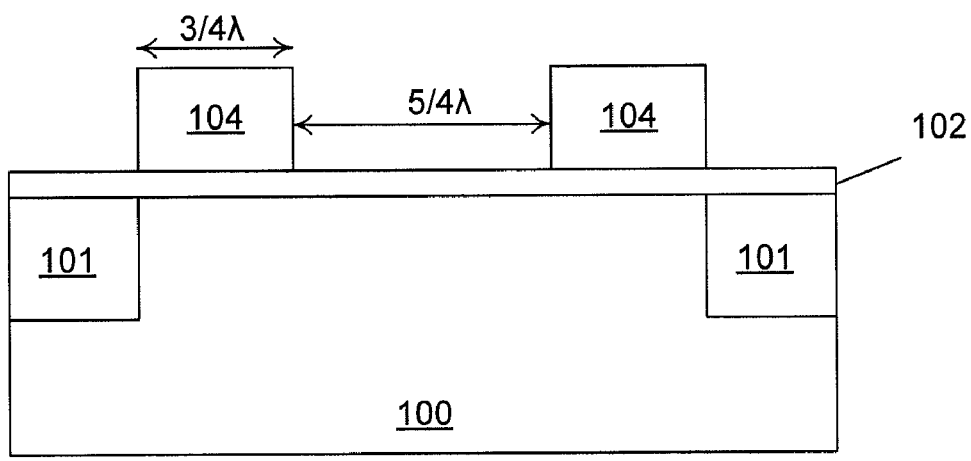
Figure 13:
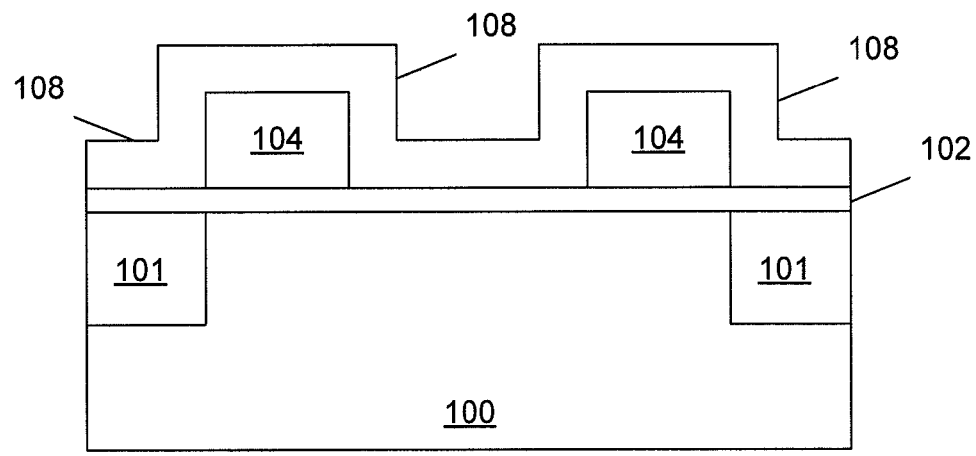

Similarly, in etching second layer 104, the etching process may include controlling the photoresist critical dimension and trim etch process to etch second layer 104 such that about 0.75λ of second layer and about 5/4λ space pattern occur, as shown in FIG. 12.

Figure 14:
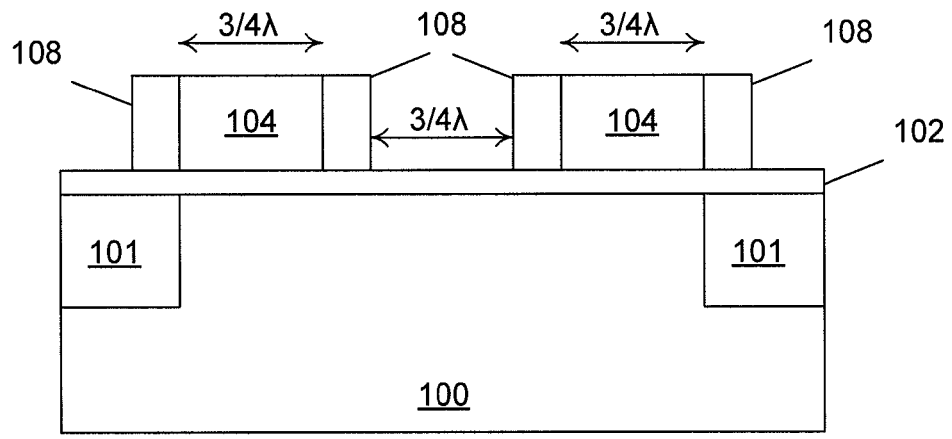
Figure 15:
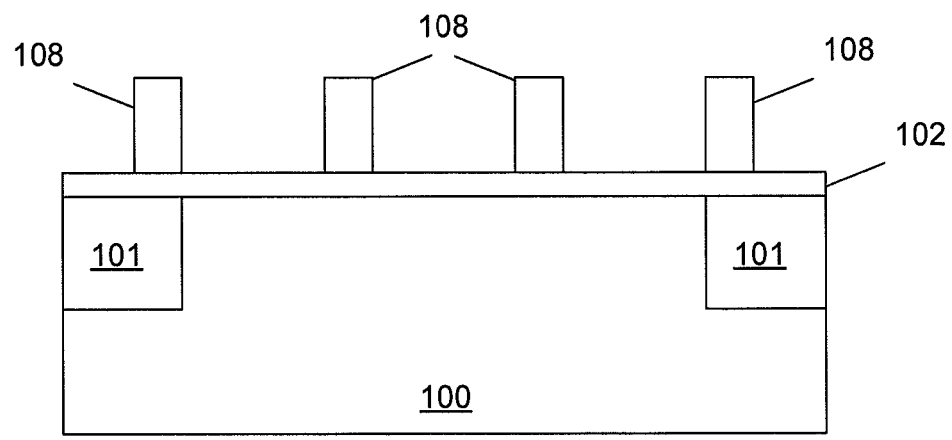

After the deposition of third layer 108 (FIG. 13), the etching of material 108 may create a spacing of 3/4λ, as shown in FIG. 14. The subsequent removal of second layer 104 is shown in FIG. 15.

Figure 16:
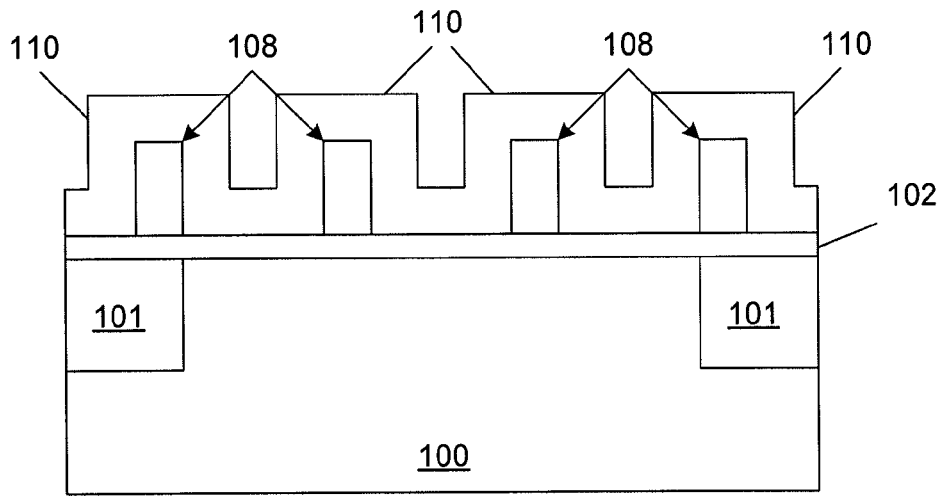
Figure 17:
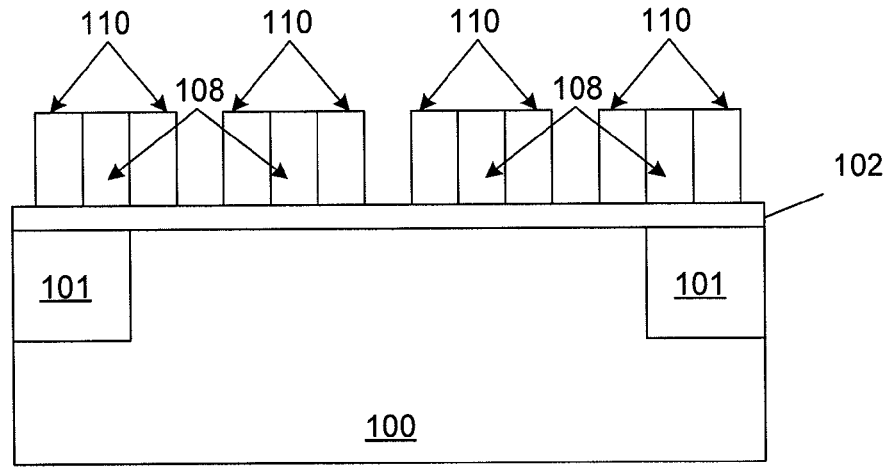
Figure 18:
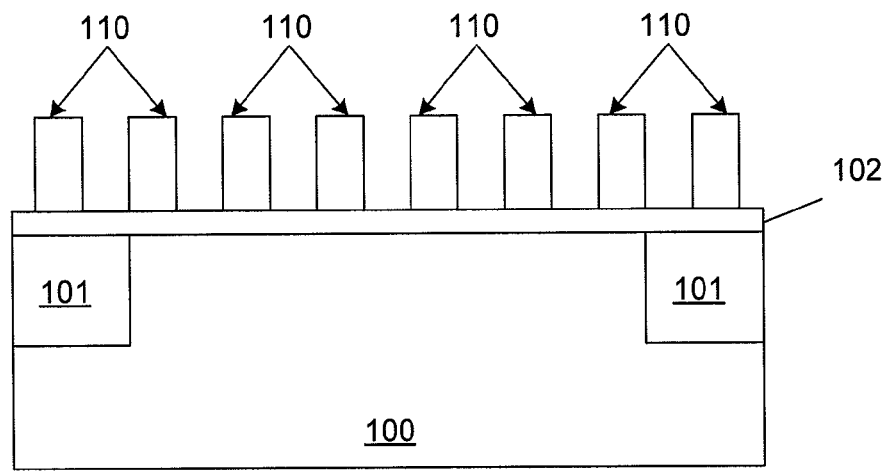
Figure 19:
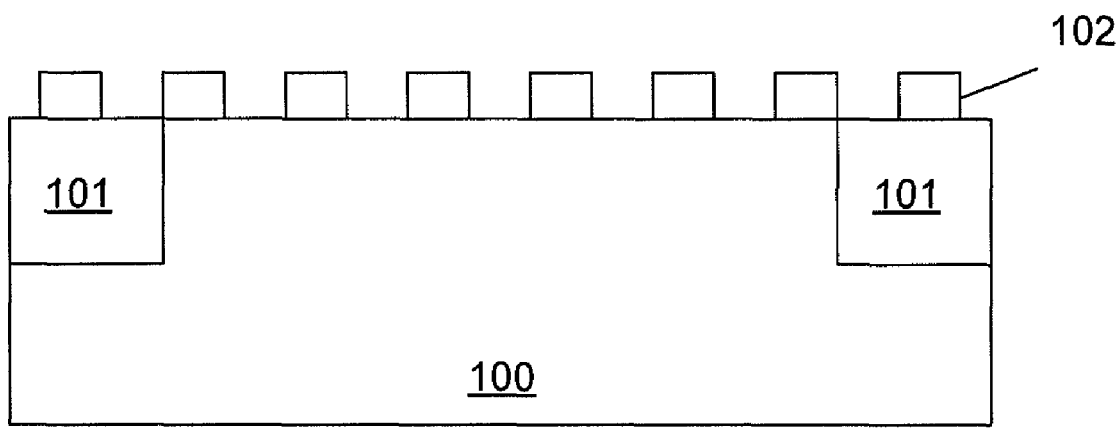

In the steps shown in FIG. 16 and 17, fourth layer 110 may be deposited and etched, respectively. In FIG. 17, fourth layer 110 may be etched using an etchant selective to third layer 108 and first layer 102, creating a space of approximately 1/4λ (FIG. 17) Third layer 108 may subsequently be removed, leaving fourth layer 110, as shown in FIG. 18.

Fourth layer 110 may be used as a patterning layer used to create a pattern in substrate 100. In one respect, fourth layer 110 may be a 1-to-1 mask having one-quarter of the original pitch, may be used as a pattern to etch first layer 102, as seen in the step illustrated by FIG. 19. In one embodiment, first layer 102 may be etched to form a 1-to-1, 0.25λ line to 0.25λ space ratio.

Figure 20:
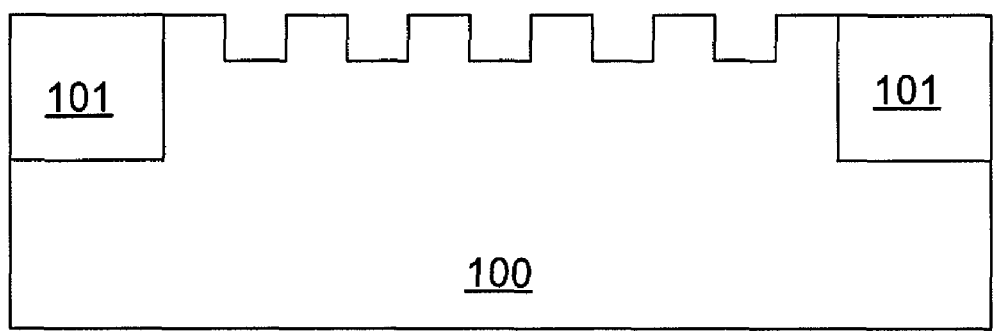

Next, an etching step may be performed to create trenches in substrate 100, as shown in FIG. 20 In some embodiments, first layer 102 may serve as a mask, or a patterning layer for the etching of substrate 100. Upon the etching or the trenches in substrate 100, first layer may be removed using techniques known in the art.

Next, substrate 100 resulting from the step shown in FIG. 20 may be annealed in a hydrogen annealing environment. In one embodiment, substrate 100 may be subjected to a hydrogen ambient for about 1 to 60 minutes at a temperature of about 800° C. to about 1000° C. The resultant structure includes a non-planar, corrugated surface of substrate 100, as shown in FIG. 21

The above embodiment is an example of a ¼ line and ¼ space fabrication used to create a non-planar, corrugated surface on a substrate, although other dimensions are contemplated and may be used. For example, the line spacing techniques of U.S. Pat. Ser. No. 11/220,898 filed Sep. 7, 2005 entitled "Methods for Fabricating Sub-Resolution Line Space Patterns," incorporated in its entirety herein by reference, may be used to create a line to space ratio that may be etched into a substrate and subsequently be annealed to create, amongst other things, a non-planar, corrugated substrate using the techniques of the present disclosure.

It is also noted that the above embodiment shows a corrugated surface in one layer, e.g., a homogenous material such as the substrate material. The corrugated surface may include multiple layers of different semiconductor and/or dielectric materials. For example, the corrugated surface may include a semiconductor layer formed over a dielectric layer.

Figure 21:
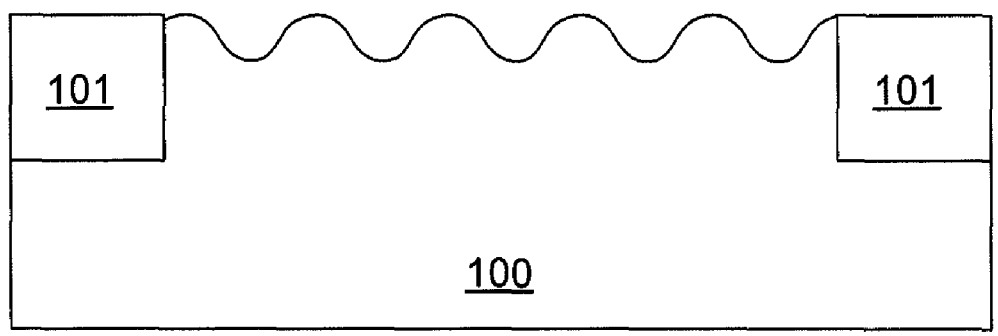

In one respect, a device including, without limitation, a metal oxide semiconductor (MOS) device may be fabricated on the non-planar or corrugated substrate surface shown in FIG. 21. For examples, techniques described in U.S. Ser. No. 11/173,230 filed Jul. 1, 2005 entitled "Method of IC Production Using Corrugated Substrates," U.S. Ser. No. 11/173,231 filed Jul. 1, 2005 entitled "Integrated Circuit on Corrugated Substrate," and U.S. Ser. No. 11/173,237 filed Jul. 1, 2005 entitled "Segmented Channel MOS Transistor," incorporated herein by reference each in their entirety, may be used to fabricate devices on non-planar or corrugated surfaces.

Figure 22:
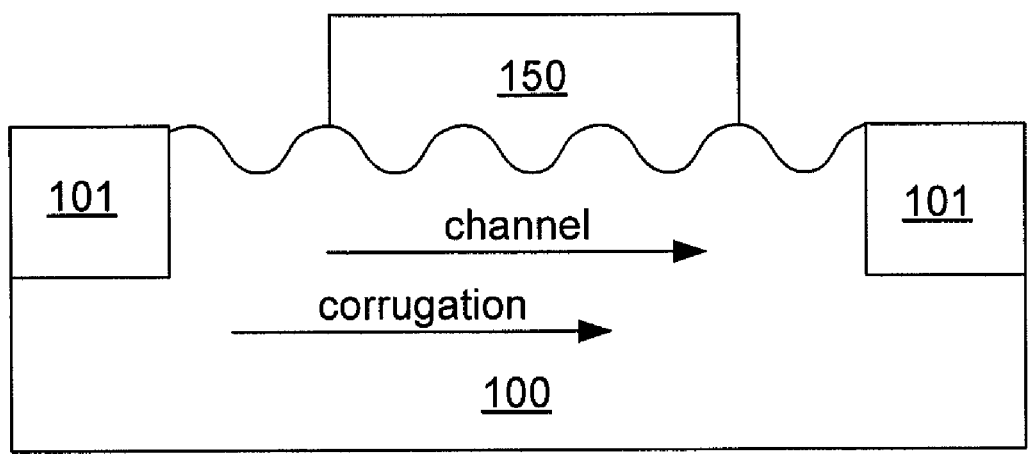
FIG. 22 is a structure having a channel parallel to the corrugation of a substrate surface, in accordance with embodiments of the present disclosure.

The device may have a channel parallel to the non-planar substrate surface similar to the structure with channel 150 shown in FIG. 22. The fabrication of devices on these non-planar or corrugated substrates result in a longer channel length, and thus, a smaller drain to source current ($I_{DS}$) when compared to conventional devices fabricated on a substantially planar substrate. As known to one with ordinary skill in the art, the current between the drain and the source for a MOS device is inversely proportional to the length of the channel using the following voltage-current relation:

$$I_{DS} = \frac{\mu_n C_{ox}}{2} \frac{W}{L} (2(V_{GS} - V_{th})V_{DS} - V_{DS}^2), \quad \text{Eq. 1}$$

where $\mu_n$ is the charge-carrier mobility, W is the channel width, L is the channel length, $C_{ox}$ is the capacitance at the channel, $V_{GS}$ is the gate to source voltage, $V_{th}$ is the threshold voltage, and $V_{DS}$ is the drain to source voltage.

Figure 23:
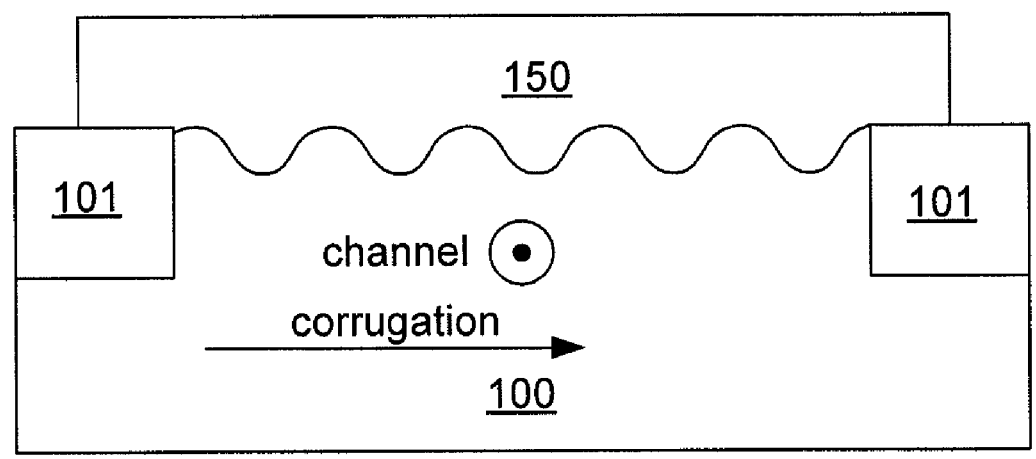
FIG. 23 is a structure having a channel perpendicular to the corrugation of a substrate surface, in accordance with embodiments of the present disclosure.

Alternatively, a device may be fabricated with a channel perpendicular to the non-planar substrate surface, similar to the structure with channel 150 shown in FIG. 23. The structure includes devices that include a wider channel width and a larger $I_{DS}$ (using Eq. 1) as compared to devices fabricated on a substantially planar substrate.

The present disclosure also contemplates fabricating other devices on the non-planar substrate surface. The devices may include, without limitation, a field effect transistor (FET), a multi-gate field effect transistor, a fin field effect transistor, a tri-gate transistor, a Π transistor, and a Ω transistor. More generally, the devices may include any devices having a channel region.

The present disclosure provides, among other advantages, an increase in channel length while minimizing a reduction in area. For example, referring to FIG. 24A, an inverter layout including PMOS region 1500 having a channel 1504 width to length ratio of 1 to 1 (W/L) and NMOS region 1502 having a channel 1504 width to length ratio of 2 to 1 (2W/L) is shown. The inverter of FIG. 24A is a conventional, substantially planar substrate surface.

In contrast, referring to the inverter of FIG. 24B, the length and the width of channel 1504 is increased by twofold using the non-planar, corrugated surface where the PMOS region 1500 has a channel 1504 width to length ratio of 1 to 2 (W/2L) and NMOS region 1502 with a channel 1504 width to length ratio of 2 to 1 (2W/L). The total area of the inverter of FIG. 24B is about 30% less than the area of the inverter of FIG. 24A.

Similarly, the area of a circuit, such as a static random accessory memory (SRAM) circuit may also benefit from the present disclosure. Referring to FIGS. 125A and 25B, a SRAM circuit layout using conventional substantially substrate is compared to a SRAM circuit layout using the non-planar, corrugated substrate of the present disclosure are shown, respectively. The area of the SRAM of FIG. 25B is approximately 17% less than the SRAM of FIG. 25A.

Fabricating Other Semiconductor Structures

Using the techniques of the present disclosure, various structures for semiconductor applications may be designed. One of ordinary skill in the art would recognize that the steps may be used to fabricate various different patterns needed in, for example, device design.

Bent or Crank Structures

Figure 26A:
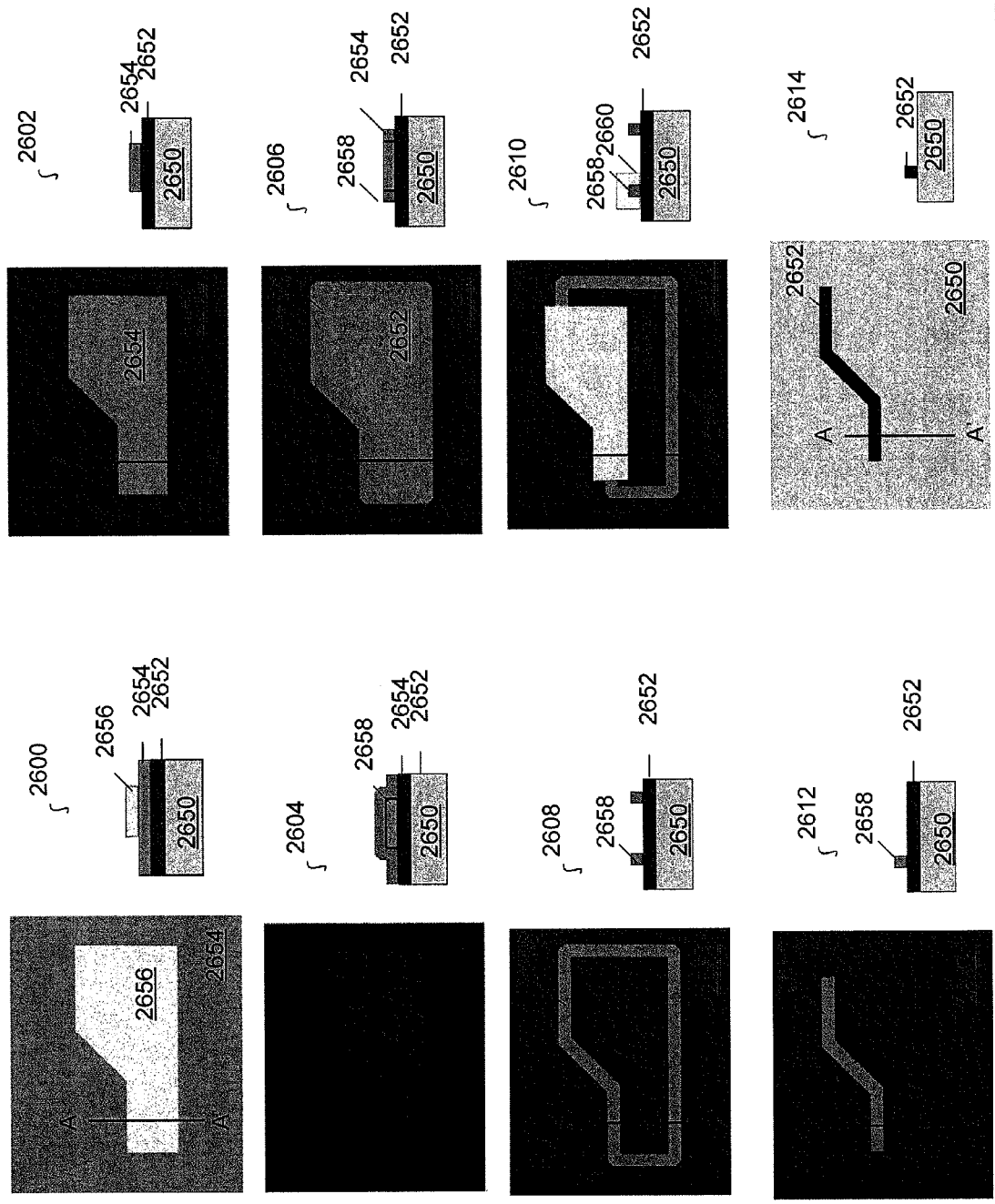
FIGS. 26A and 26B are steps for fabricating a bent or crank semiconductor structures, in accordance with embodiments of the present disclosure.
Figure 26B:
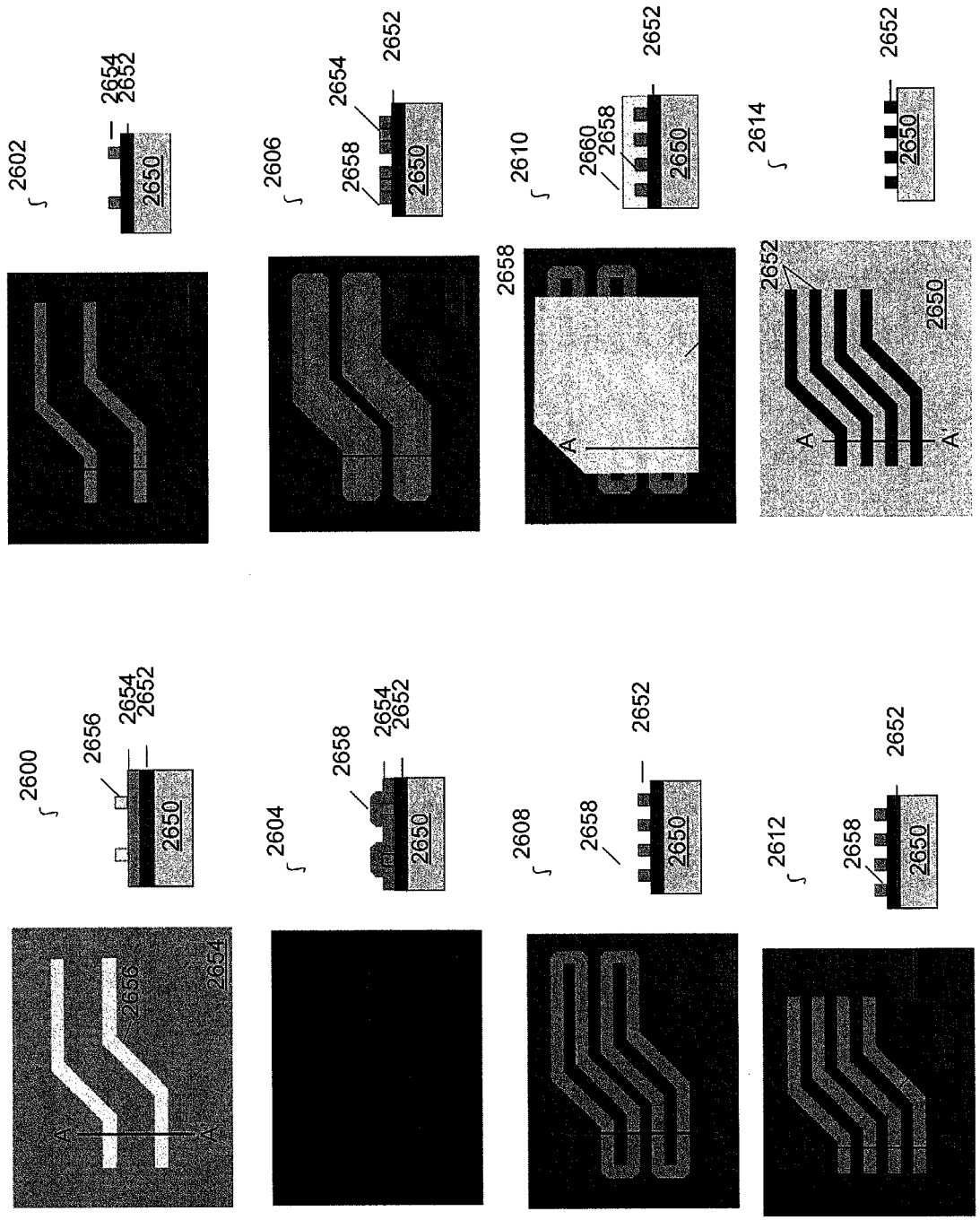

For example, a bent or crank structure may be fabricating using the steps shown in FIGS. 26A and 26B. The steps shown in FIGS. 26A and 26B are similar to the steps shown in FIGS. 1-9. In one respect, in step 2600 of FIG. 26A, a top-view and a profile view of the structure at line A-A'. The structure shown in step 2600 includes a first layer 2652, second layer 2654, and patterned photoresist layer 2656 deposited on a substrate 2650 is shown. Next, in step 2602, the pattern of photoresist layer 2656 may be transferred to second layer 2654. Patterned photoresist layer 2656 may be subsequently removed.

In step 2604, third layer 2658 may be deposited on the resultant structure shown in step 2602. Next, an etching technique (e.g., wet or dry etch) may be used to etch back third layer 2658, the resultant structure is shown in step 2606. In step 2608, second layer 2654 may be removed.

A clipping pattern may be defined, as shown in step 2610. In particular, fourth layer 2660 may be deposited on the resultant structure of step 2608, and may be subsequently patterned. In some embodiments, fourth layer 2660 may expose a portion of third layer 2658.

In step 2612, third layer 2658 may be etched. In some embodiments, fourth layer 2660 may be a masking layer to protect a portion of third layer 2658. Therefore, any portions of third layer 2658 that is exposed may be etched away. Fourth layer 2660 may subsequently be removed using techniques known in the art, and the resultant structure is shown in step 2612.

In step 2614, patterned third layer 2658 may be used as a mask to etch portions of first layer 2652. In other words, the pattern of third layer 2658 may be transferred to first layer 2652 using techniques such as dry or wet etching.

It is noted that different bent or crank patterns may be transferred onto first layer 2652. Referring to FIG. 26B, steps similar to steps 2600 through 2614 of FIG. 26A are performed, but the resultant structure is different due to the patterning of certain layers (e.g., the deposition and patterning of photoresist layer 2656 in step 2600, defining the clipping pattern in step 2610, etc.).

Bi-Directional Structures

Figure 27:
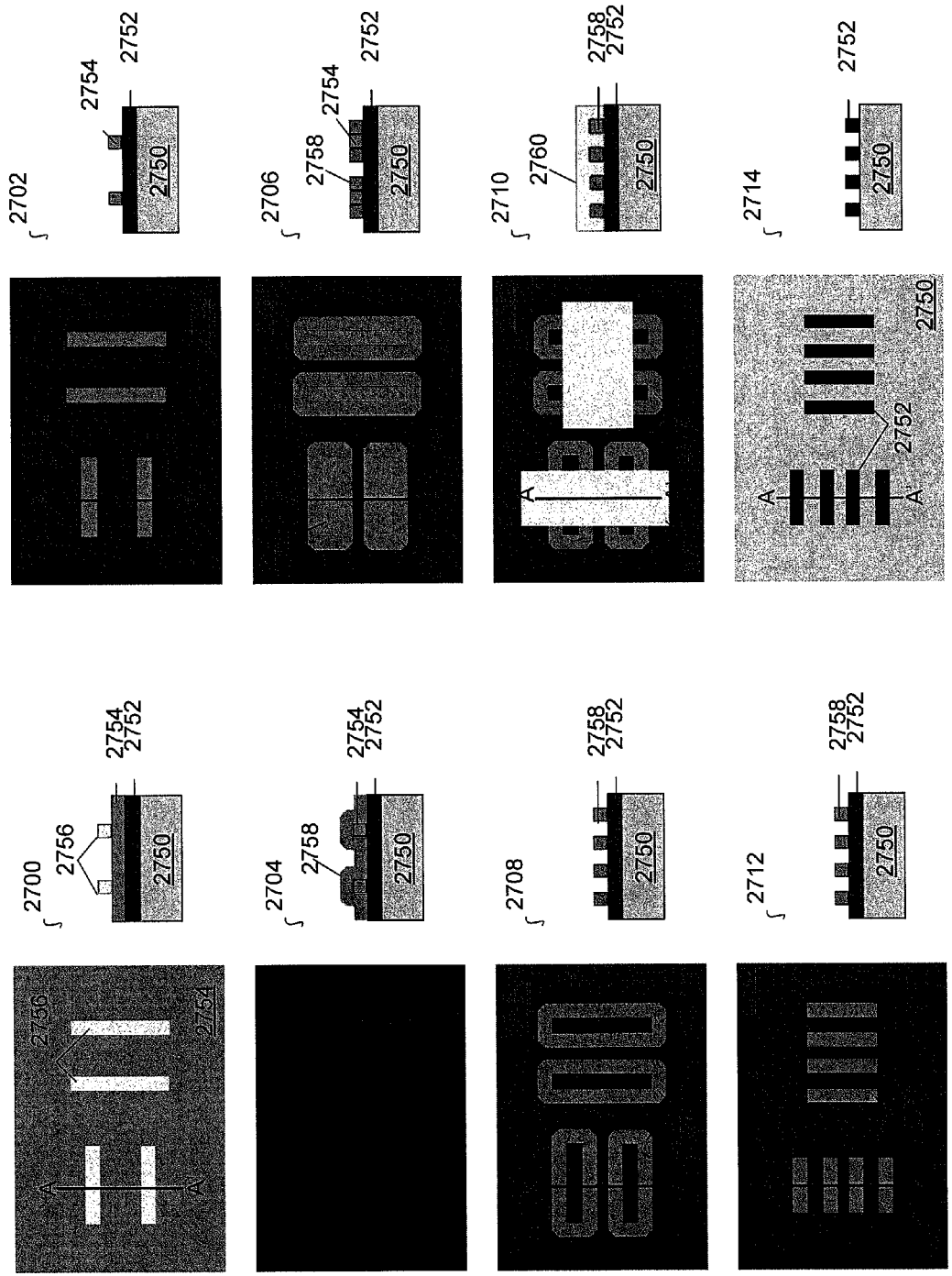
FIG. 27 are steps for fabricating bi-directional semiconductors line structure, in accordance with embodiments of the present disclosure.

Referring now to FIG. 27, steps for fabricating a bi-directional structure is shown. The steps shown in FIG. 27 are similar to the steps shown in FIGS. 1-9. In step 2700, a top-view and a profile view of the structure at line A-A' is shown. The structure includes a first layer 2752, second layer 2754, and patterned photoresist layer 2656 deposited on a substrate 2750. In step 2702, the pattern of photoresist layer 2756 may be transferred to second layer 2754. Patterned photoresist layer 2756 may be subsequently removed using techniques known in the art.

In step 2704, third layer 2758 may be deposited on the resultant structure shown in step 2702. Next, an etching technique (e.g., wet or dry etch) may be used to etch back third layer 2758, the resultant structure is shown in step 2706. After the etching of the third layer, second layer 2754 may be removed, the resultant structure shown in step 2708.

Next, a clipping pattern may be defined, as shown in step 2710. In particular, fourth layer 2760 may be deposited on various portions of the resultant structure of step 2708, and may be subsequently patterned. In step 2712, third layer 2758 may be etched. In some embodiments, a portion of third layer 2758, and more particularly, portions of third layer not protected fourth layer 2760 may be etched away. Fourth layer 2760 may subsequently be removed using techniques known in the art, and the resultant structure is shown in step 2712.

In step 2714, patterned third layer 2758 may be used as a mask to etch portions of first layer 2752. In other words, the pattern of third layer 2758 may be transferred to first layer 2652 using techniques such as dry or wet etching to form the bi-directional line structure.

CD Changed Structure

Figure 28:
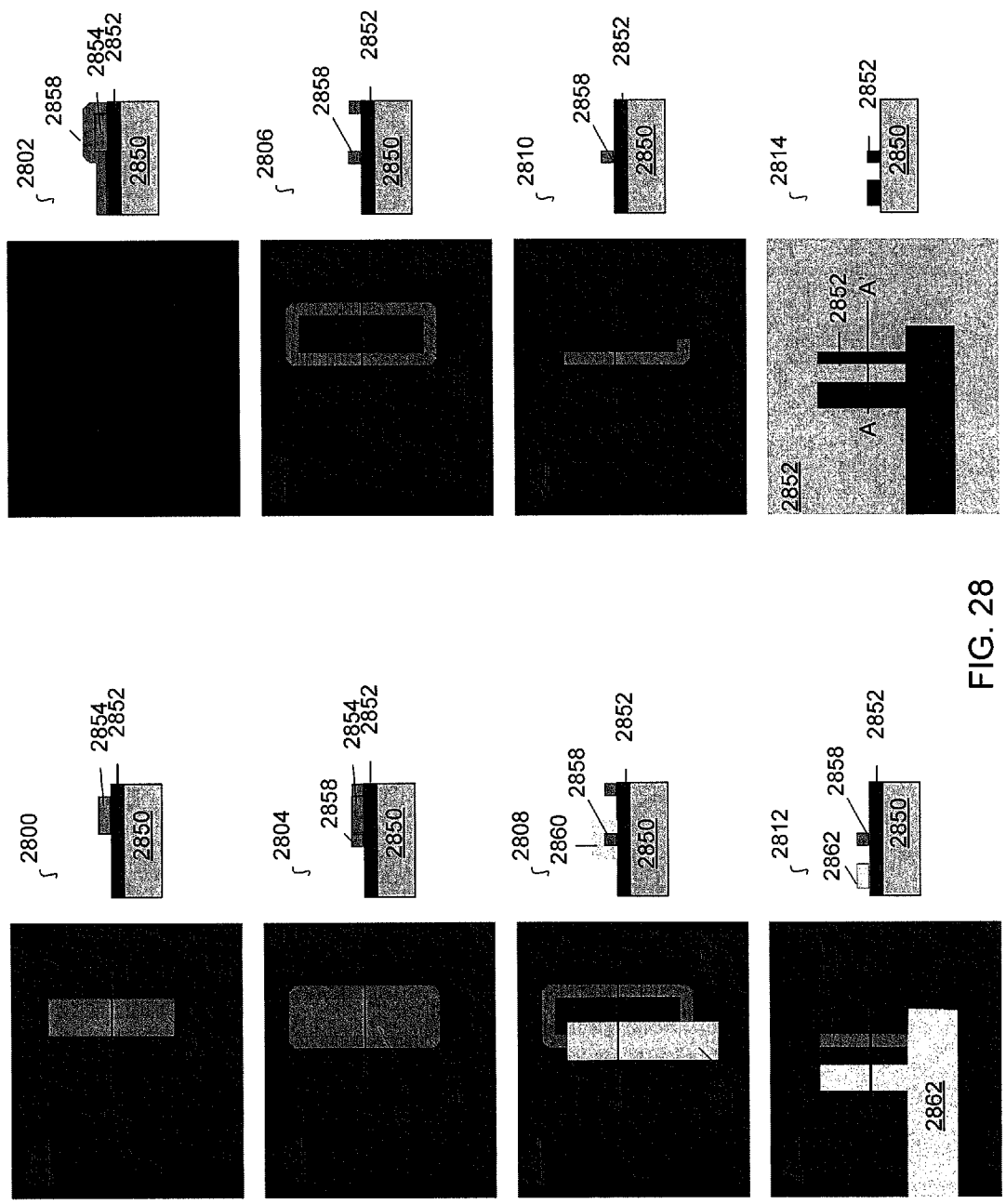
FIG. 28 are steps for fabricating CD changed semiconductor structures, in accordance with embodiments of the present disclosure.

Similarly, the techniques of the present disclosure may also be used to fabricate CD changed structure, as shown in FIG. 28. In particular, steps 2800 through 2814 are similar to the steps shown in FIGS. 1 through 9. In step 2800, a top-view and a profile view of the structure at line A-A' is shown. The first layer 2852 may be deposited on substrate 2850. Second layer 2854 may be deposited on first layer 2852, and may subsequently be patterned using techniques known in the art. For example, in one respect, a photoresist layer may be deposited and patterned on 2852. An etching technique, selective to first layer 2852 may be used to etch and pattern second layer 2854 and the photoresist layer may subsequently be removed.

In step 2802, third layer 2858 may be deposited on the resultant structure shown in step 2800. Next, an etching technique (e.g., wet or dry etch) may be used to etch back third layer 2858, the resultant structure is shown in step 2804. In step 2806, second layer 2854 may be removed.

A clipping pattern may be defined, as shown in step 2808. In particular, fourth layer 2860 may be deposited on the resultant structure of step 2806, and may be subsequently patterned. In step 2810, third layer 2858 may be etched. In some embodiments, a portion of third layer 2858, and more particularly, portions of third layer not protected by fourth layer 2760 may be etched away. Fourth layer 2860 may subsequently be removed using techniques shown in the art and the resultant structure is shown in step 2810.

In step 2812, fifth layer 2862 may be deposited to define an arbitrary pattern. In one respect, fifth layer 2862 may be deposited on the resultant structure of step 2810 and subsequent patterned using techniques known in the art (e.g., etching, CMPs, etc.). Using the resultant structure from step 2812 as a pattern, first layer 2852 may be etched in step 2814. In particular, the pattern shown in step 2812 may be transferred to first layer 2852.

Independent Line Directional Change Structure

Figure 29:
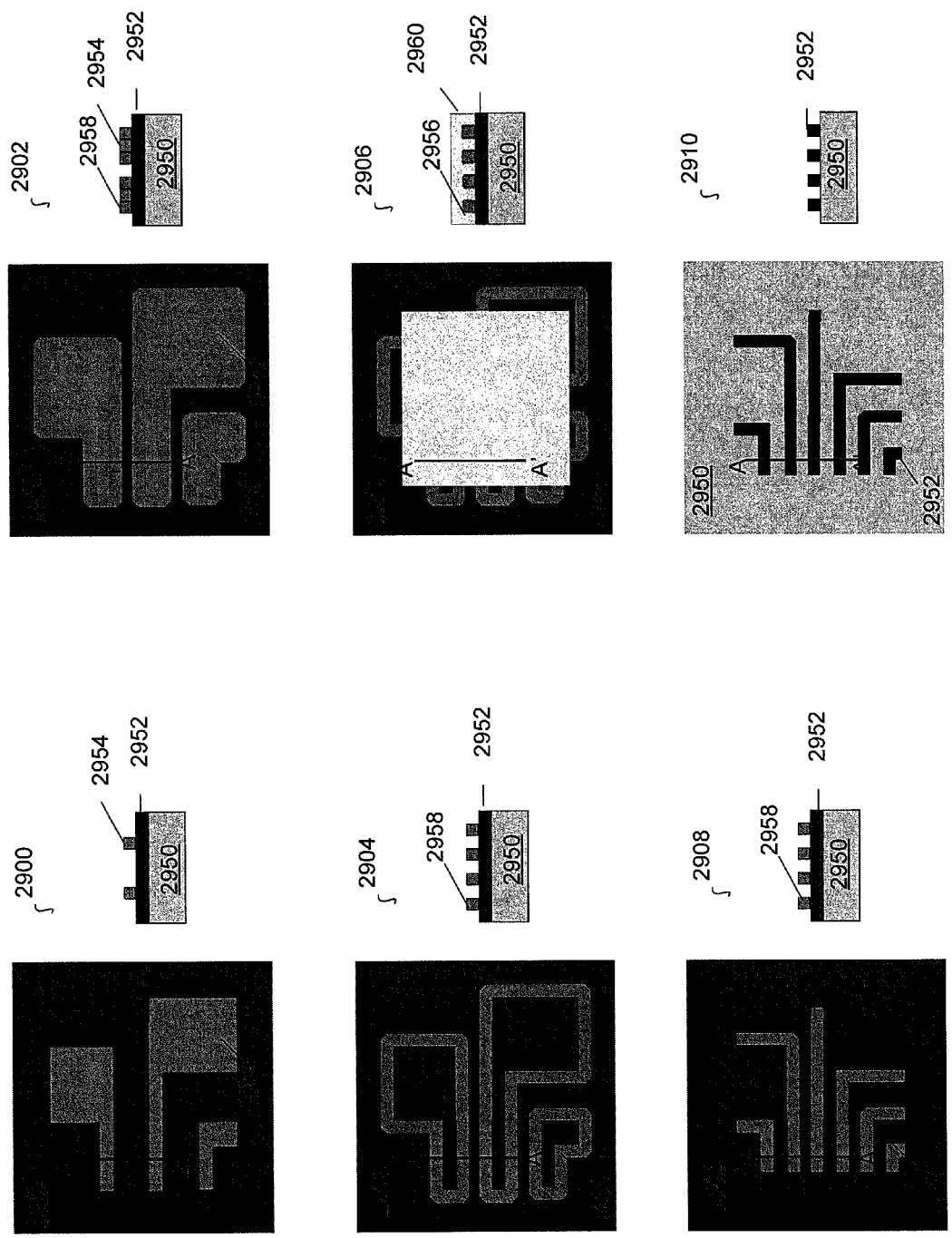
FIG. 29 are steps for fabricating semiconductor line structures, in accordance with embodiments of the present disclosure.

The present disclosure may also provide techniques for fabricating a series of line having changing directions (relative to the x- and/or y-axis). Referring to FIG. 29, steps for fabricating these lines are shown. In particular, steps similar to those shown in FIGS. 1-9 are used.

In one respect, referring to step 2900 of FIG. 29 a top-view and a profile view of the structure at line A-A' is shown. First layer 2952 may be deposited on substrate 2950. Second layer 2954 may be deposited on first layer 2952, and may subsequently be patterned using techniques known in the art. For example, in one respect, a photoresist layer may be deposited and patterned on 2952. An etching technique, selective to first layer 2952 may be used to etch and pattern second layer 2954 and the photoresist layer may subsequently be removed, as shown in step 2900.

Next, third layer 2958 may be deposited on the resultant structure shown in step 2900. An etching technique (e.g., wet or dry etch) may be used to etch back third layer 2958, the resultant structure is shown in step 2902. In step 2904, second layer 2954 may be removed.

A clipping pattern may be defined, as shown in step 2906. In particular, fourth layer 2960 may be deposited on v the resultant structure of step 2904, and may be subsequently patterned. In step 2908, third layer 2958 may be etched. In some embodiments, a portion of third layer 2958, and more particularly, portions of third layer not protected by fourth layer 2960 may be etched away. Fourth layer 2960 may subsequently be removed using techniques known in the art and the resultant structure is shown in step 2908.

In step 2910, patterned third layer 2958 may be used as a mask to etch portions of first layer 2952. In other words, the pattern of third layer 2958 may be transferred to first layer 2952 using techniques such as dry or wet etching to form the bi-directional line structure.

"T" Structures

Figure 30A:
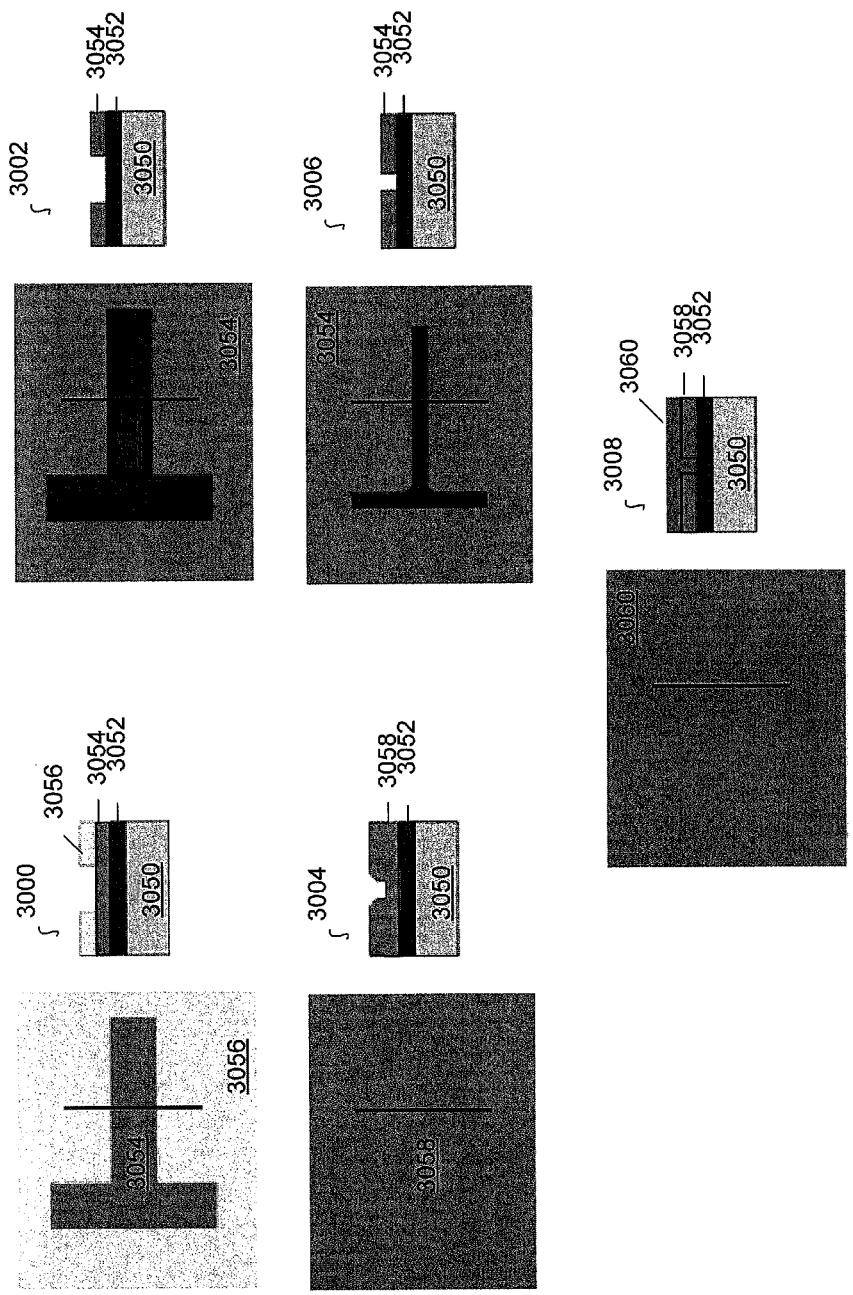
FIGS. 30A through 30E are steps for fabricating T-structures, in accordance with embodiments of the present disclosure.
Figure 30B:
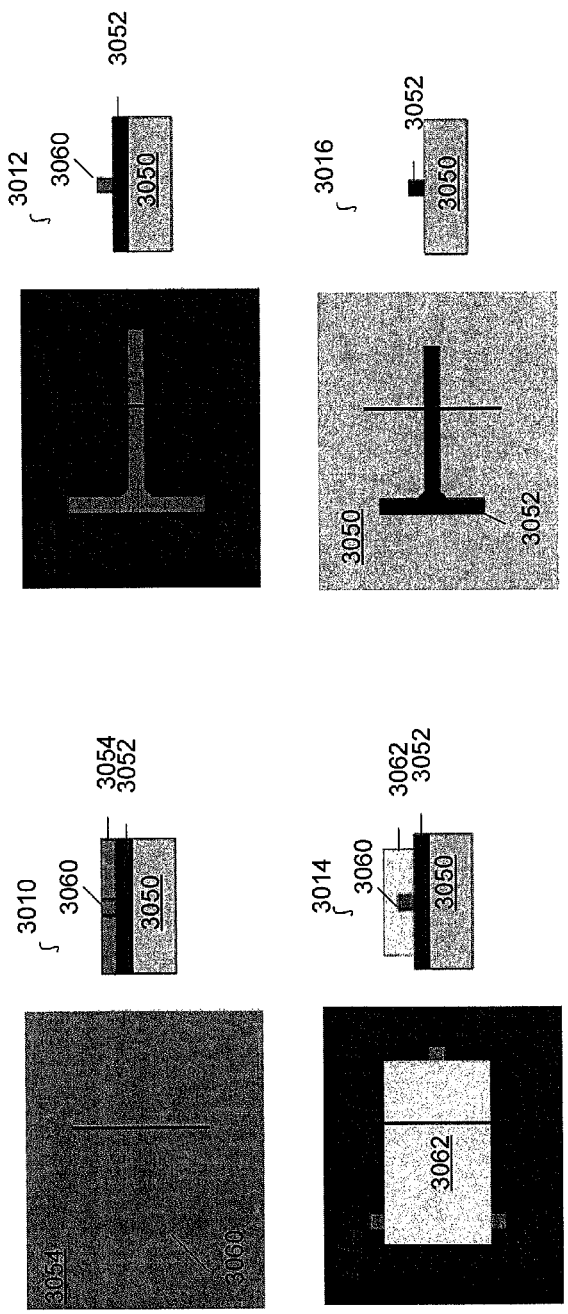

Referring to FIGS. 30A and 30B, steps for fabricating an isolated T-structure are shown. The steps are similar to the steps shown in FIGS. 1-9 of the present disclosure. In one respect, in step 3000 of FIG. 30A, a top-view and a profile view of a first layer 3052, second layer 3054, and patterned photoresist layer 3056 deposited on a substrate 3050 is shown. Next, in step 3002, the pattern of photoresist layer 3056 may be transferred to second layer 3054. Patterned photoresist layer 3056 may be subsequently removed.

In step 3004, third layer 3058 may be deposited on the resultant structure shown in step 3002. In some respects, third layer 3058 may include the same material as second layer 3054. Alternatively, third layer 3058 may be a different material from second layer 3054. Next, an etching technique (e.g., wet or dry etch) may be used to etch back third layer 3058, the resultant structure is shown in step 3006. Next, in step 3008, fourth layer 3060 may be deposited on the resultant structure shown in step 3006.

Referring to FIG. 30B, in step 3010, fourth layer 3060 may be etched using a dry and/or wet etching technique selective to second layer 3054. In step 3012, second layer 3054 may be subsequently removed.

Next, a clipping pattern may be defined, as shown in step 3014. In particular, fifth layer 3062 may be deposited on various portions of the resultant structure of step 3012, and may be subsequently patterned. Then, in step 3016, using the patterned fourth layer 3060 as a mask, first layer 3052 may be etched to form the isolated T-structure.

Figure 30C:
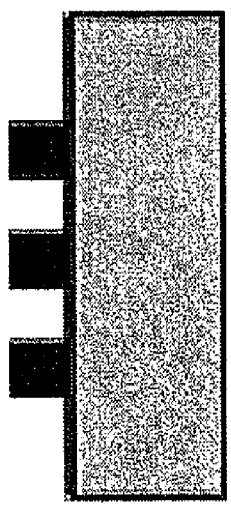
Figure 30C:
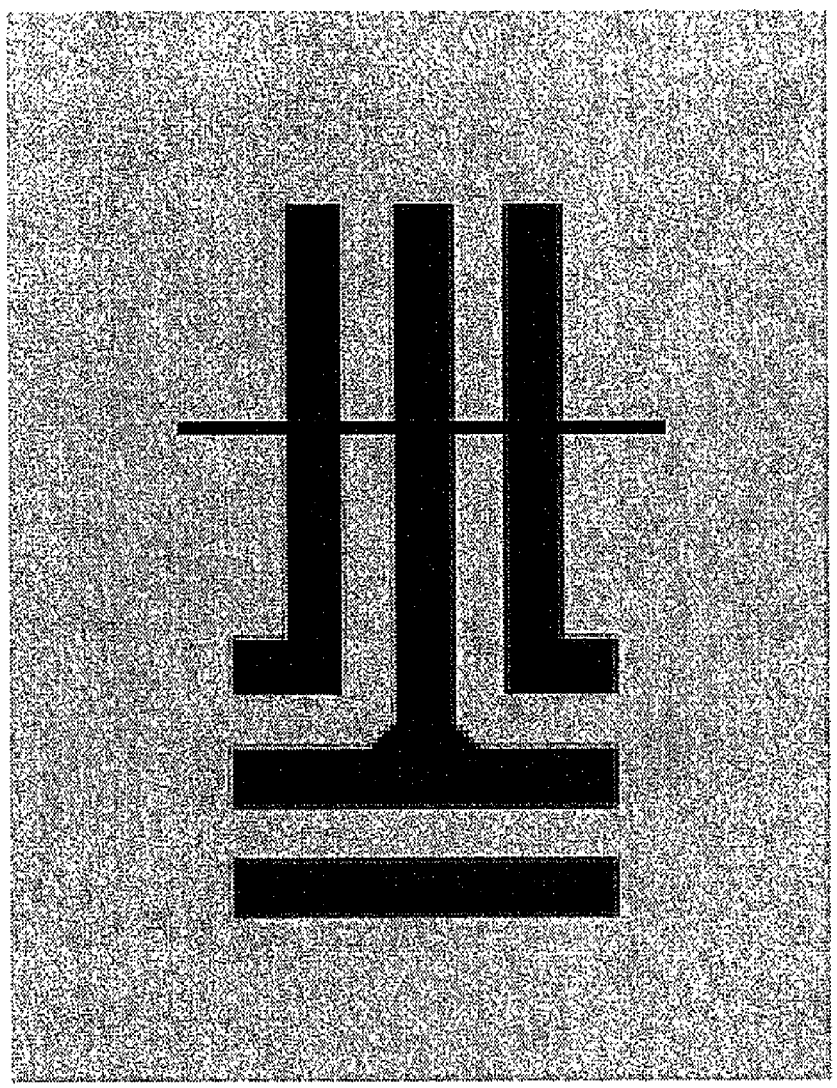
Figure 30D:
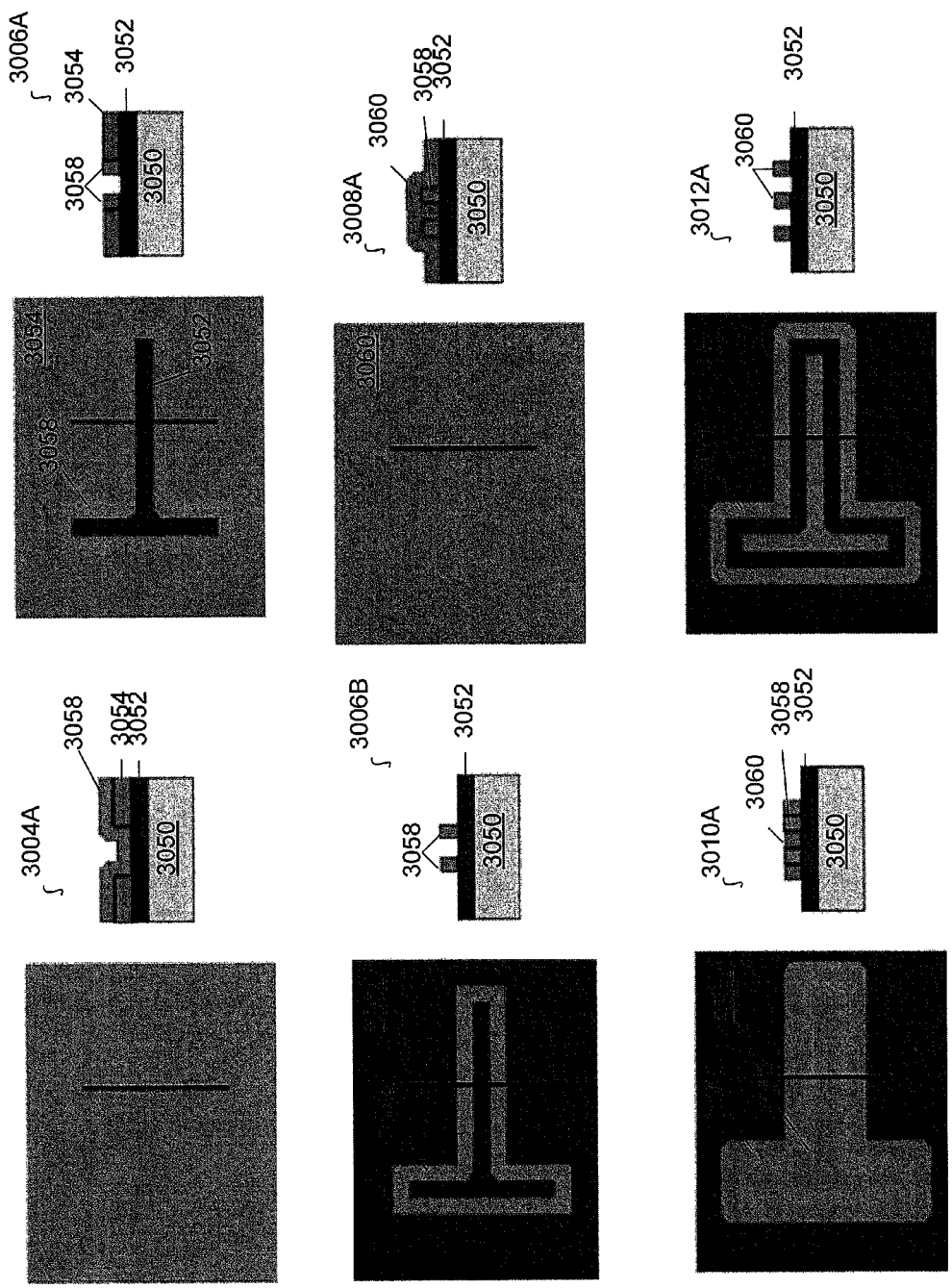
Figure 30E:
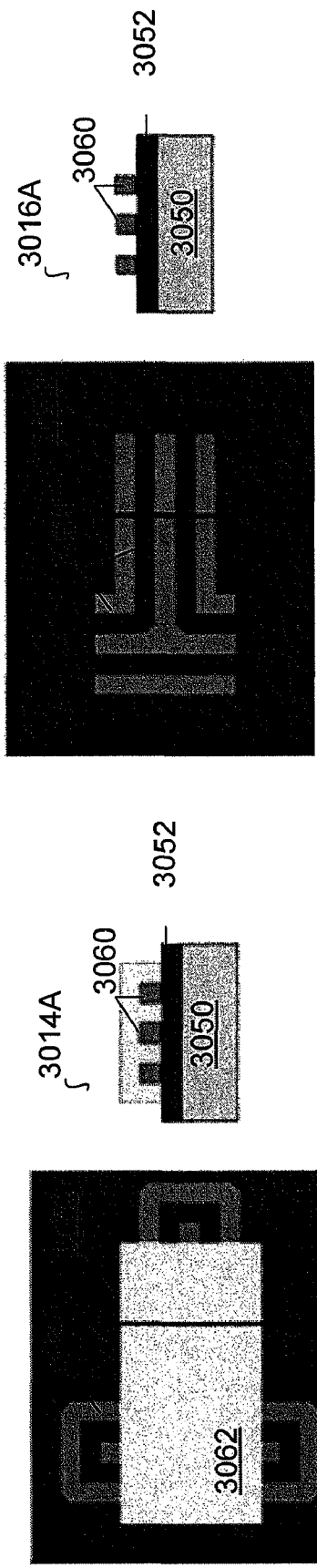

It is noted that the steps shown in FIGS. 30A and 30B may be used to fabricate dense T-structures shown in FIG. 30C. Referring to FIGS. 30D and 30E, in one respect, steps 3000 and 3002 may be performed. Next, in step 3004A, third material 3058 may be deposited. Third material 3058 may subsequently be etched, resulting in the structure shown in step 3006A of FIG. 30D. In step 3006B, second material 3054 may be removed.

In step 3008A, fourth layer 3060 may be deposited on the resultant structure shown in step 3006B. Next, in step 3010A, fourth layer may be etched using a dry and or wet etching technique selective to third material 3058 and first layer 3052. In step 3012A, third material 3058 may subsequently be removed.

A clipping pattern may not be defined, as shown in step 3014A. In particular, fifth layer 3062 may be deposited on various portions of the resultant structure of step 3012A, and may be subsequently patterned, exposing a portion of forth layer 3060. Using fifth layer 3062 as a masking layer, fourth layer may be etched using techniques such as, but not limited to dry and/or wet etch, as shown in step 3016A In particular, the areas of fourth layer 3060 not protected by fifth layer 3062 may be removed. Fifth layer 3062 may subsequently be removed. Next, using the, patterned fourth layer 3060 as a mask, first layer 3052 may be etched to form a dense T-structure, similar to the structure shown in FIG. 30C.

Electrically Testable Isolated/Dense Serpentine

By using pitch-doubling, patterns may be obtained that are at a much tighter pitch than can be obtained with conventional optical lithography alone. Moreover, by repeating the spacer process, quarter-pitch patterns may be obtained, as described in U.S. patent Ser. No. 11/220,898 filed Sep. 7, 2005 entitled "Methods for Fabricating Sub-Resolution Line Space Patterns," incorporated herein by reference. Although pitch-doubling and pitch-quadrupling needs only a well implemented integration strategy, a creative lithography strategy is needed in order to create a useful electrical device. Since spacers may create features that are smaller than the capabilities of optical lithography, the initial pattern may take account for the size and overlay limitations of the subsequent lithography steps in the pattern creation. The following are examples of using this mix-and-match strategy to create useful, electrically testable devices. These examples are by no means meant to be exhaustive and one of ordinary skill in the art would recognize that many other types of devices are possible with the techniques described herein.

Figure 31A:
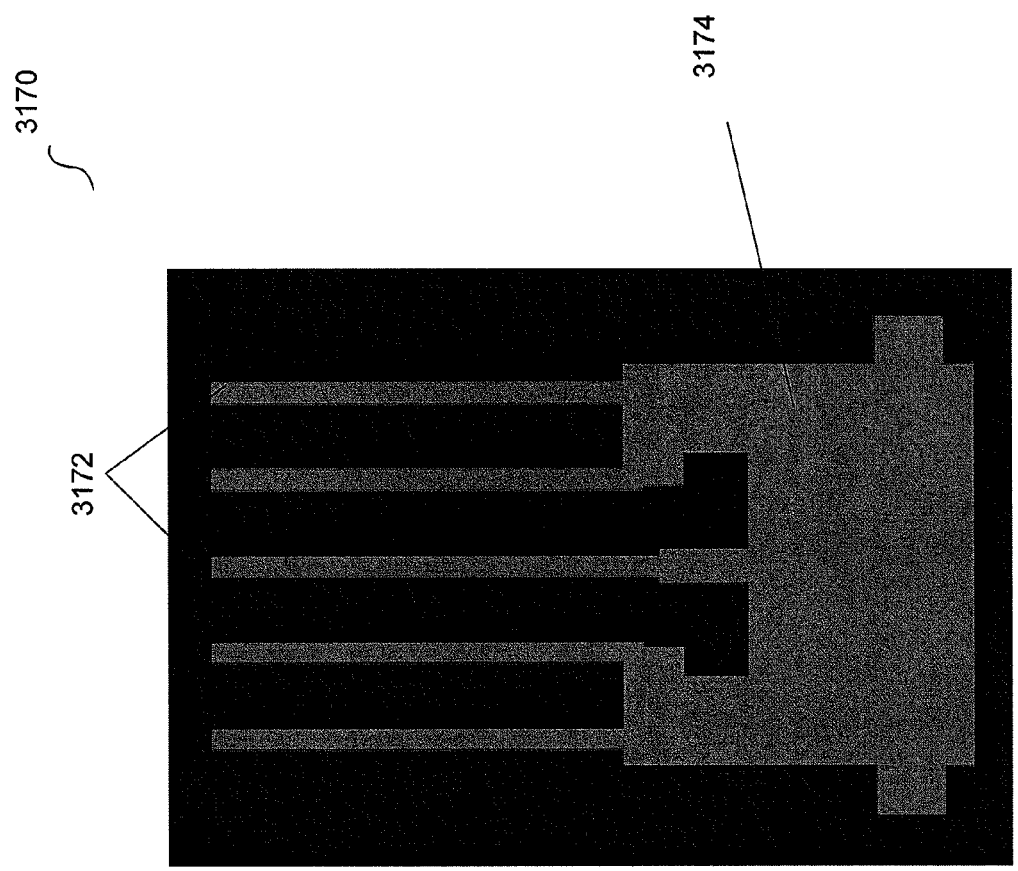
FIG. 31A is an initial pattern used for fabricating an electrically testable line, in accordance with embodiments of the present disclosure.

Referring to FIG. 31A, an initial pattern that may be used to form an electrically testable line 3170 (resistance serpentine) is shown. Tines 3172 define the initial pitch. This pitch may be doubled by the space process of the present disclosure. In one respect, the pitch pattern may be fabricated using, for example, a binary mask or an alternating phase shift mask in conjunction with a trim mask. Line 3170 may also include internal taps 3174. In one respect, large areas in the line pattern may allow taps to be attached to the spacer serpentine with conventional optical lithography.

Figure 31B:
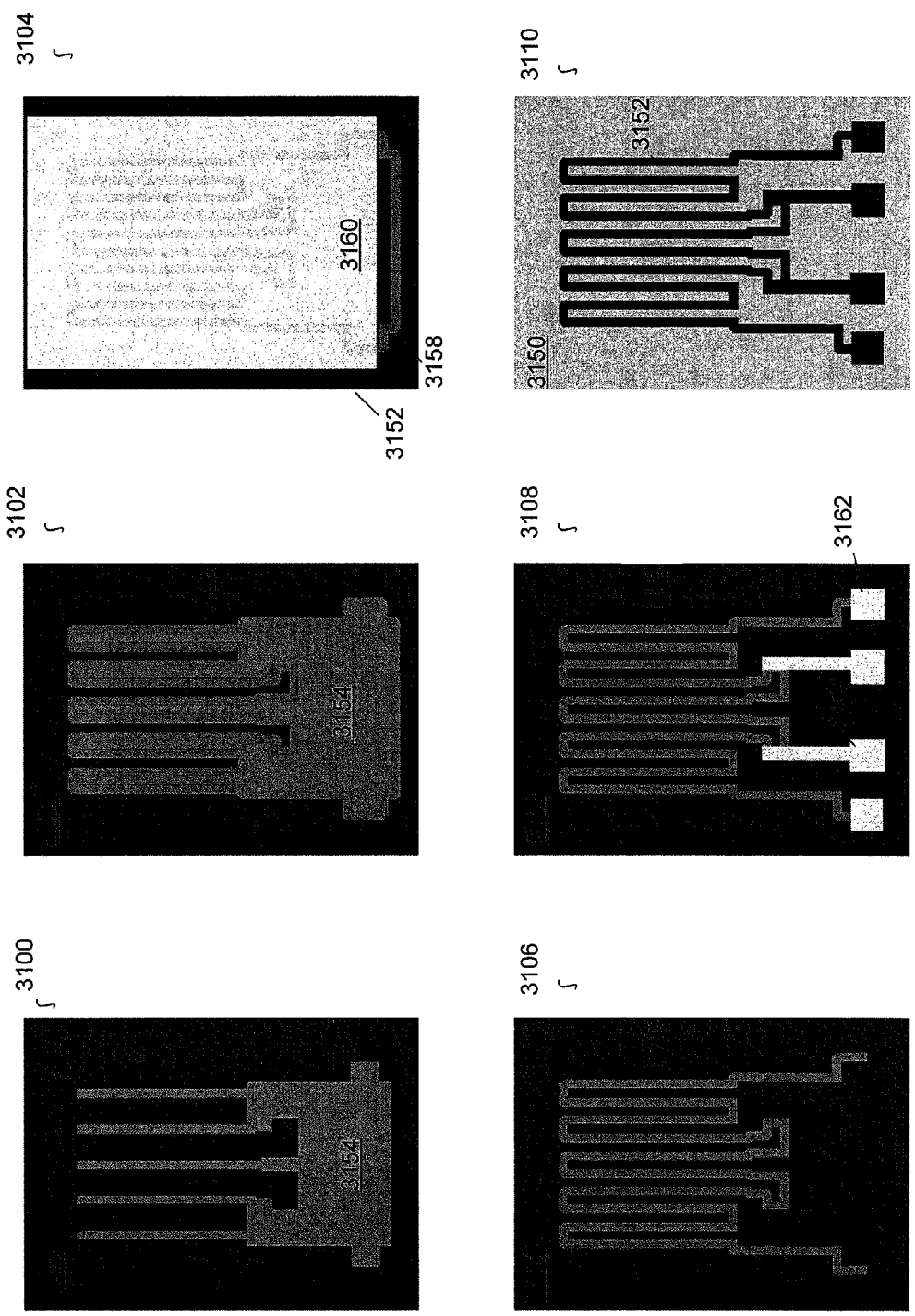
FIG. 31B are steps for fabricating the electrically testable line of FIG. 31A, in accordance with embodiments of the present disclosure.

Referring to FIG. 31B, steps for fabricating line 3170 are shown. The steps shown in FIG. 31B are similar to the steps shown in FIGS. 1-9. In step 3100 (showing a top view of the resultant structure), first layer 3152 and second layer 3154 may be deposited on substrate 3150 (not shown). Second layer 3154 may be patterned using various techniques known in the art. For example, in one respect, a photoresist layer may be deposited and patterned on 3154. An etching technique, selective to first layer 3152 may be used to etch and pattern second layer 3154 and the photoresist layer may be subsequently removed.

In step 3102, third layer 3158 may be deposited on the resultant structure shown in step 3102. Next, an etching technique (e.g., wet or dry etch) may be used to etch back third layer 3158, the resultant structure is shown in step 3102. Subsequently, second layer 3154 may be removed using etching techniques known in the art.

Next, a clipping pattern may be defined. In particular, fourth layer 3160 may be deposited on the resultant structure of step 3102. Fourth layer 3160 may be subsequently patterned.

Next, in step 3106, third layer 3158 may be etched. In some embodiments, a portion of third layer 3158, and more particularly, portions of third layer not protected by fourth layer 3160 may be etched away. Fourth layer 3160 may subsequently be removed using techniques known in the art resultant structure is shown in step 3106.

In step 3108, a fifth layer 3162 may be deposited and subsequently patterned using techniques known in the art. The resultant pattern of step 3108 may be used as a mask to etch portions of first layer 3152, as shown in step 3110. In other words, the resultant structure shown 3108 may be transferred to first layer 3152 using techniques such as dry or wet etching to form the line 3170.

Figure 32A:
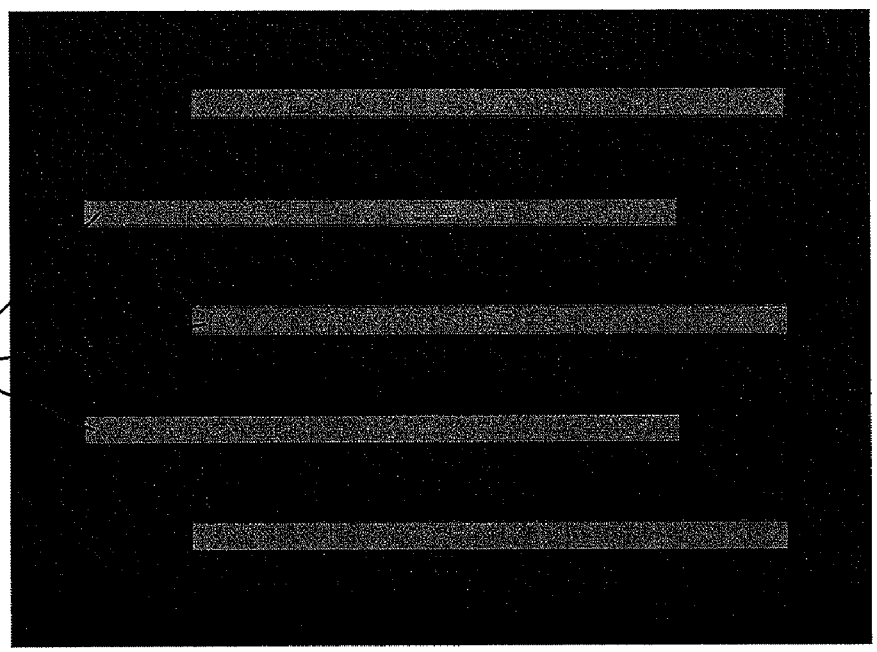
FIG. 32A is an initial pattern used for fabricating a testable isolated comb structure, in accordance with embodiments of the present disclosure.

Similarly, the steps shown in FIG. 31B or the steps shown in FIGS. 1-9 may be applied to the fabrication of electrically testable lines, more particularly, comb structure 3208 shown in FIG. 32A. The initial pattern (element 3270 of FIG. 32A) is one example of many different approaches, and one of ordinary skill in the art would recognize that combs of different pitches may also be fabricated.

Referring to FIG. 32A, lines 3272 may be staggered to allow room to connect every other line to a tap. It is noted that the lines may be position in other configurations to allow for easy access to the lines as appropriate for design specifications.

Figure 32B:
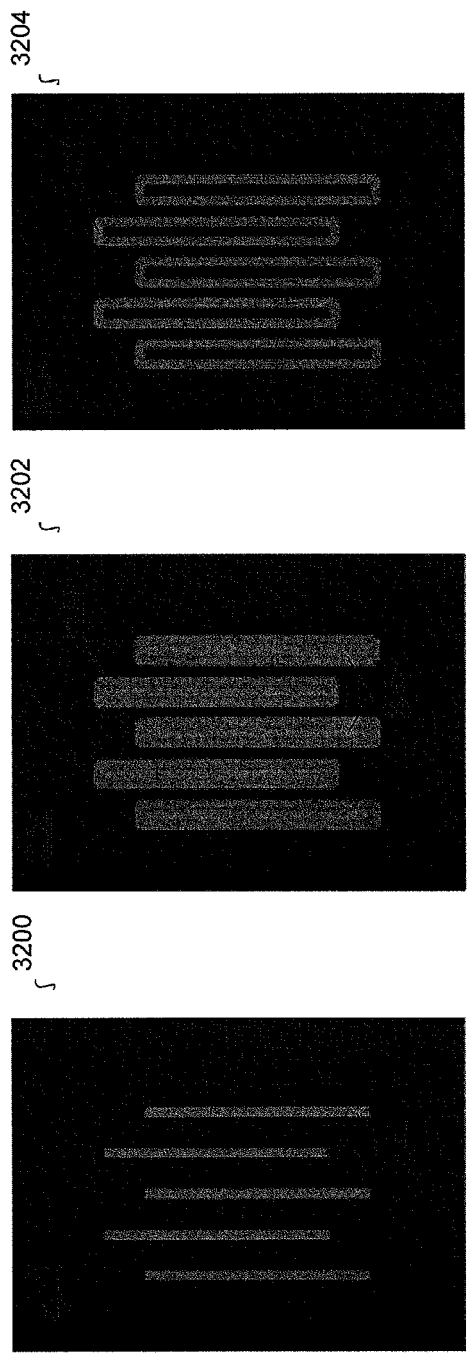
FIGS. 32B are steps for fabricating the comb structure of FIG. 32A, in accordance with embodiments of the present disclosure.
Figure 32B:
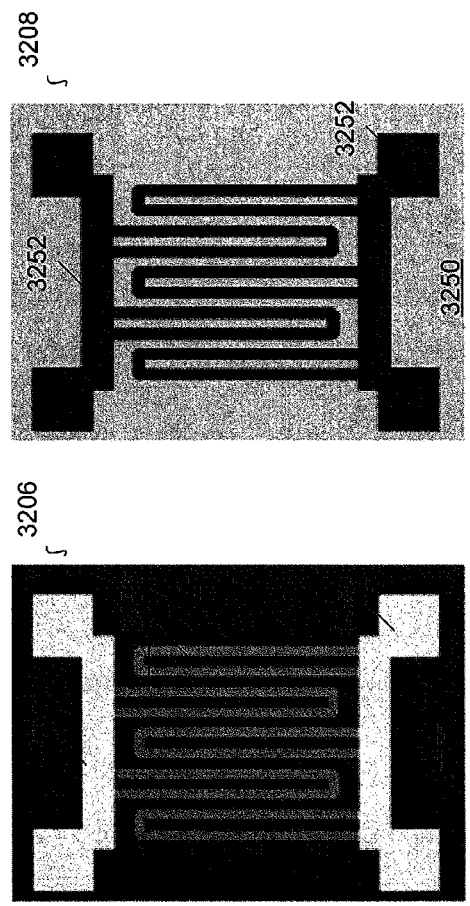

In one respect, initial pattern 3270, as shown in FIG. 32B may be used to form a comb structure. The steps shown in FIG. 32B are similar to the steps shown in FIGS. 1-9. In step 3200 (showing a top view of the resultant structure), first layer 3252 and second layer 3254 may be deposited on substrate 3250 (not shown). Second layer 3254 may be patterned using various techniques known in the art. For example, in one respect, a photoresist layer may be deposited and patterned on 3254. An etching technique, selective to first layer 3252 may be used to etch and pattern second layer 3254 and the photoresist layer may be subsequently removed.

In step 3202, third layer 3258 may be deposited on the resultant structure shown in step 3200. Next, an etching technique (e.g., wet or dry etch) may be used to etch back third layer 3258, the resultant structure is shown in step 3202. Subsequently, second layer 3154 may be removed using etching techniques known in the art, as shown in step 3204.

Next, in step 3204, a fourth layer 3260 may be deposited on the resultant structure of step 3204 and subsequently patterned using techniques known in the art. In one respect, lithography techniques may be used to define the shape of fourth layer 3260. The resultant pattern of step 3206 may be used as a mask to etch portions of first layer 3252, as shown in step 3208. In other words, the resultant structure shown 3206 may be transferred to first layer 3252 using techniques such as dry or wet etching to form comb 3270 of FIG. 32A.

Figure 33:
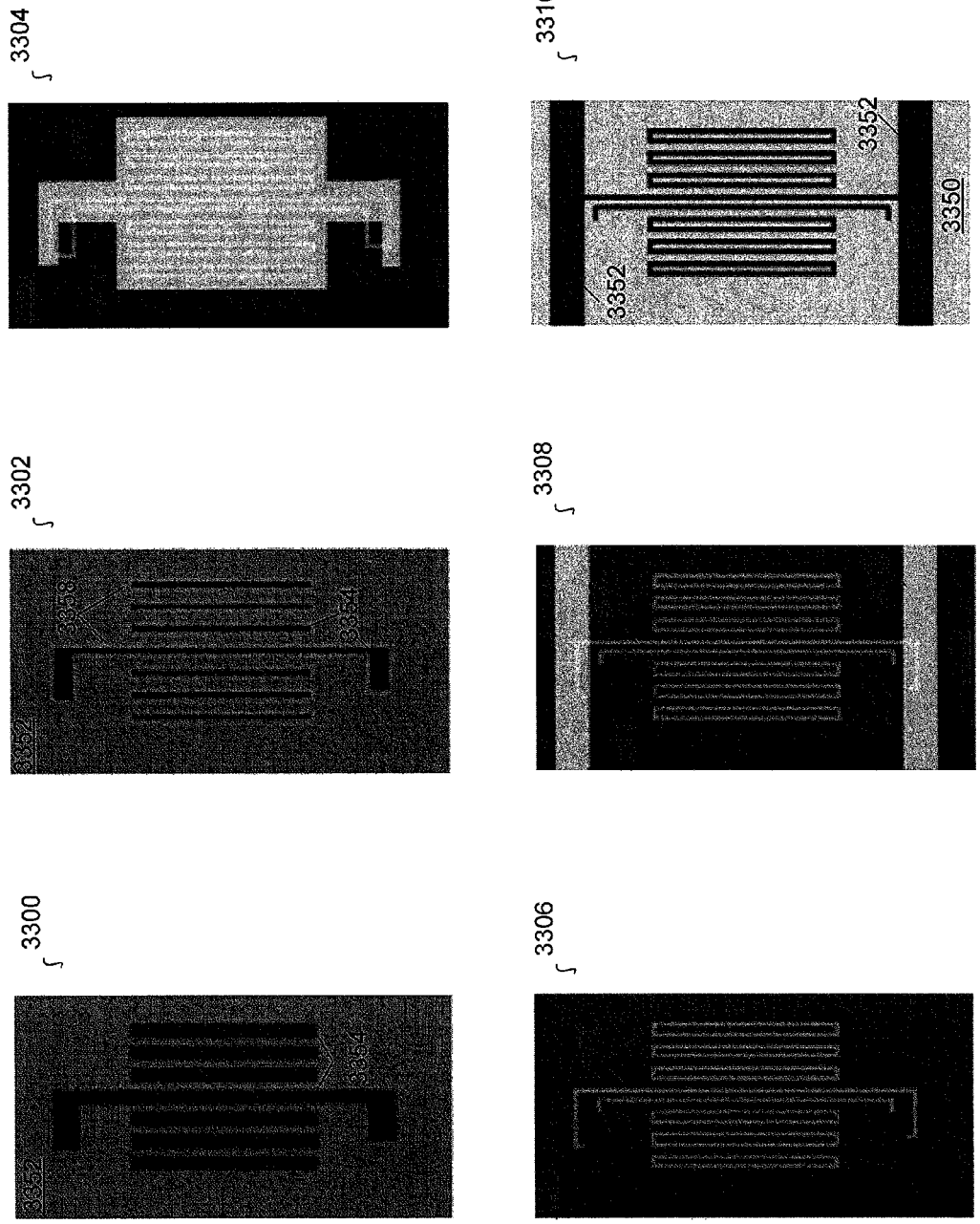
FIG. 33 are steps for fabricating the resistor structure, in accordance with embodiments of the present disclosure.

Additionally, the techniques of the present disclosure (e.g., steps shown in FIGS. 1-9) may also be applied to the fabrication of testable resistors, like the resistor shown in step 3310 shown in FIG. 33. Referring to FIG. 33, top-view structures resulting from fabrication steps using techniques of the present disclosure in shown. In step 3300, first layer 3352 and second layer 3354 may be deposited on substrate 3350 (not shown). Second layer 3354 may be patterned using various techniques known in the art. For example, in one respect, a photoresist layer may be deposited and patterned on 3354. An etching technique, selective to first layer 3352 may be used to etch and pattern second layer 3354 and the photoresist layer may be subsequently removed.

In step 3302, third layer 3358 may be deposited on the resultant structure shown in step 3300. Next, an etching technique (e.g., wet or dry etch) selective to second layer 3354 and first layer 3352 may be used to etch back third layer 3358, the resultant structure is shown in step 3302. Subsequently, second layer 3354 may be removed using etching techniques known in the art.

Next, in step 3304, a clipping pattern may be defined. In one respect, fourth layer 3360 may be deposited on the resultant structure of step 3302, and may be subsequently patterned. In some embodiments, fourth layer 3660 may expose a portion of third layer 3358.

In step 3306, third layer 3358 may be etched. In some embodiments, fourth layer 3360 may be a masking layer to protect a portion of third layer 3358. Therefore, any portions of third layer 3358 that is exposed (e.g., not protected by fourth layer 3330) may be etched away. Fourth layer 3360 may subsequently be removed using techniques known in the art, and the resultant structure is shown in step 3306.

Next, in step 3308, fourth layer 3260 may be deposited on the resultant structure of step 3206 and subsequently patterned using techniques known in the art. In one respect, lithography techniques may be used to define the shape of fourth layer 3360. The resultant pattern of step 3308 may be used as a mask to etch portions of first layer 3352, as shown in step 3310. In other words, the resultant structure shown 3308 may be transferred to first layer 3352 using techniques such as dry or wet etching to form resistor 3370 shown in FIG. 33A.

Fabrication of Devices Using Double-Spacer Process and Optical Lithography

As noted above, using a single-spacer process may double the pitch of a dense-line pattern. By using this spacer pattern as a template for a second spacer process, a quadruple pitch may be fabricated. The advantage of the methods of the present disclosure is a minimum line and minimum trench width in the first pattern that allows two spacer lines to merge in order to make electrical contact. In this way the inner and outer loops of the second spacer traces can be wired independently.

Figure 34A:
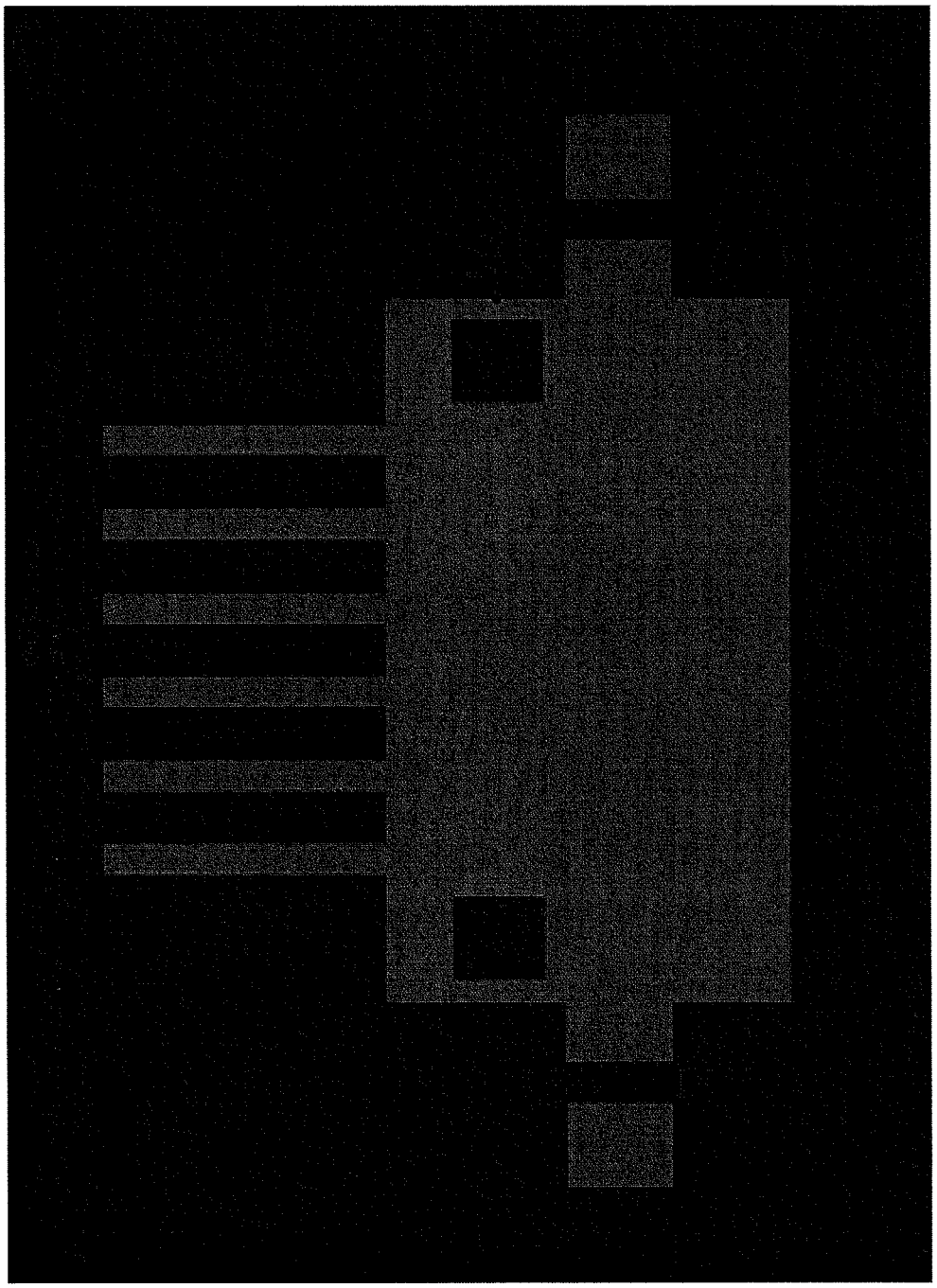
FIG. 34A is an initial pattern used for fabricating a testable pitch-quadrupled serpentine, in accordance with embodiments of the present disclosure.

Referring to FIG. 34A, the initial pattern that may form an electrically testable pitch-quadrupled serpentine is shown. Device 3470 includes tines 3472 which define the pitch. The pitch pictured may be quadrupled by the spacer process of the techniques of the present disclosure. Generally, the trench width ($T_w$) is critical, and needs to be less than about 4 times the size of the second spacer line width. The line width ($L_w$), which allows for electrical connection to the inner loop, is also critical. In one respect, the line width may be less than the quarter pitch.

Figure 34B:
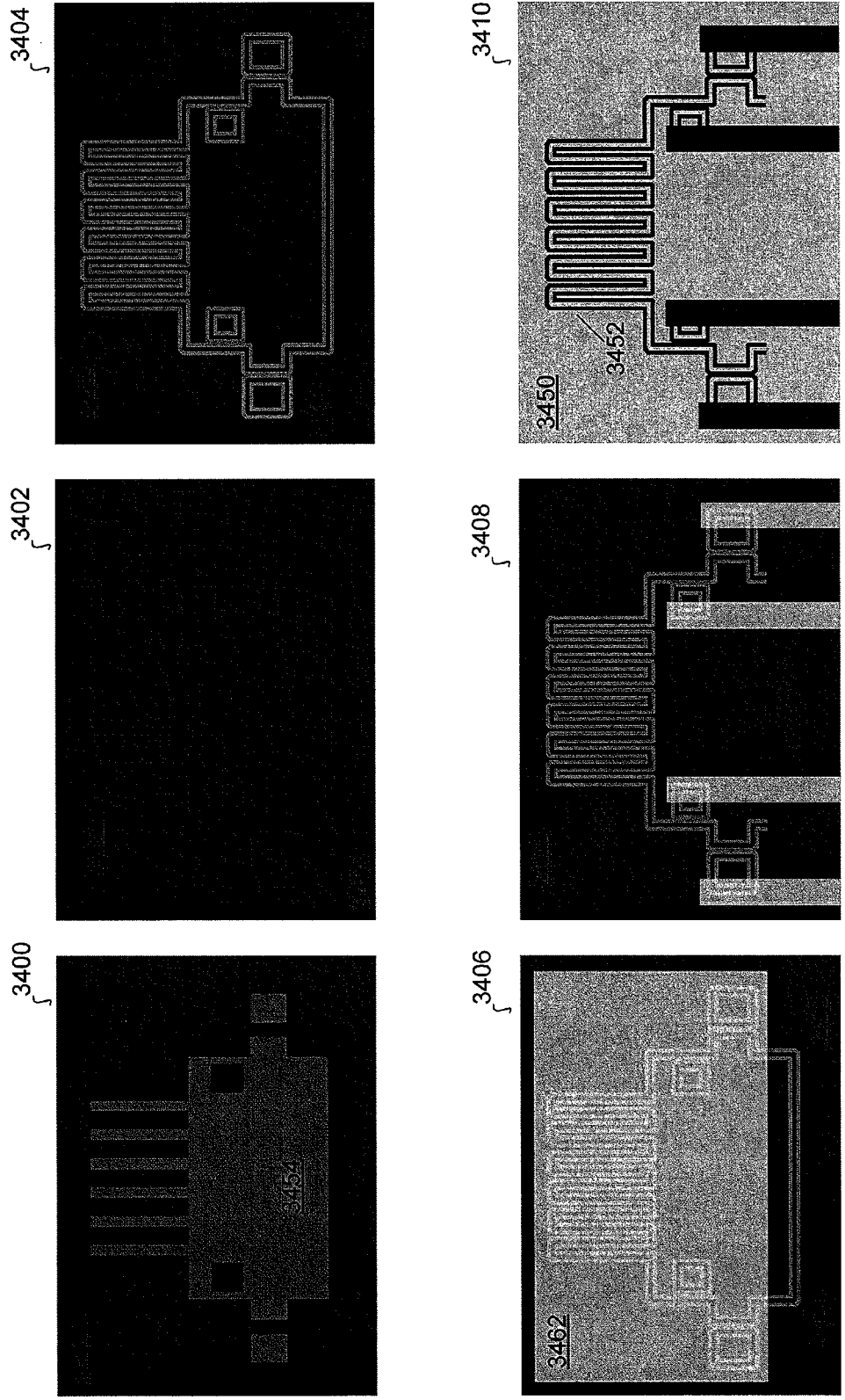
FIGS. 34B-D are steps for fabricating testable pitch-quadrupled serpentine of FIG. 34A, in accordance with embodiments of the present disclosure.

Referring to FIG. 34B, steps for fabricating device 3470 are shown. The steps shown in FIG. 34B are similar to the steps shown in FIGS. 1-9. In step 3400 (showing a top view of the resultant structure) an initial pattern is established, where first layer 3452 and second layer 3454 may be deposited on substrate 3450 (not shown). Second layer 3454 may be patterned using various techniques known in the art. For example, in one respect, a photoresist layer may be deposited and patterned on 3454. An etching technique, selective to first layer 3452 may be used to etch and pattern second layer 3454 and the photoresist layer may be subsequently removed.

In step 3402, third layer 3458 (e.g., a first spacer material) may be deposited on the resultant structure shown in step 3400. Next, an etching technique (e.g., wet or dry etch) may be used to etch back third layer 3458 and subsequently remove second layer 3454.

In step 3404, a fourth layer 3460 (e.g., a second spacer material) may be deposited. In particular, fourth layer 3460 may be deposited on third layer 3458. Fourth layer 3460 may be subsequently patterned. Third layer 3458 may subsequently be removed.

Next, in step 3406, fifth layer 3462 may be deposited and patterned to form a clipping layer. Techniques for depositing and patterning layer 3462 are known in the art. Next, third layer 3458 may be etched. In some embodiments, a portion of third layer 3458, and more particularly, portions of third layer not protected by clipping layer 3462 may be etched away. Clipping layer 3462 may subsequently be removed using techniques shown in the art.

Next, a sixth layer 3464 may be deposited and subsequently patterned (e.g., using optical lithography) to create tabs using techniques known in the art. The resultant pattern of step 3408 may be used as a mask to etch portions of first layer 3452, as shown in step 3410. In other words, the resultant structure shown 3408 may be transferred to first layer 3452 using techniques such as dry or wet etching to form the device 3470.

Figure 34C:
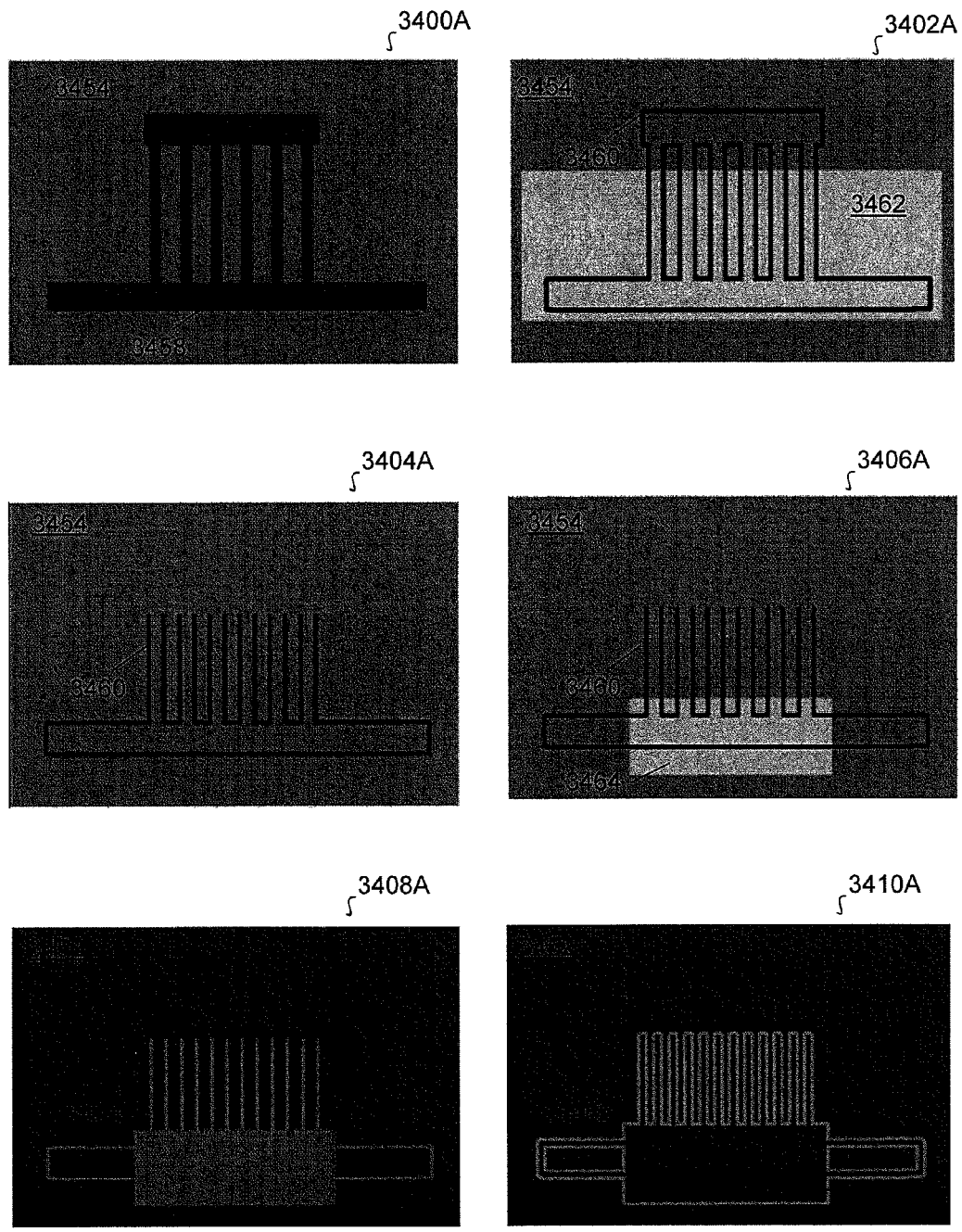
Figure 34D:
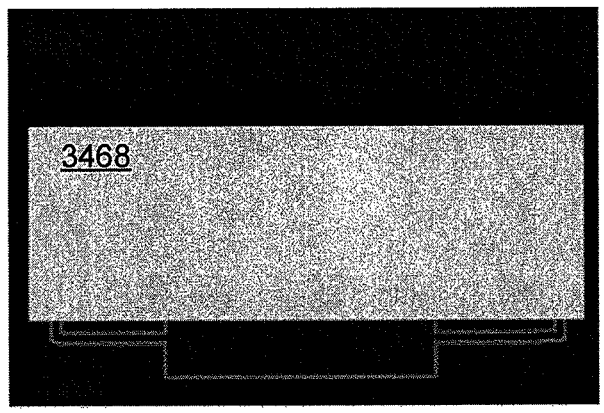
Figure 34D:
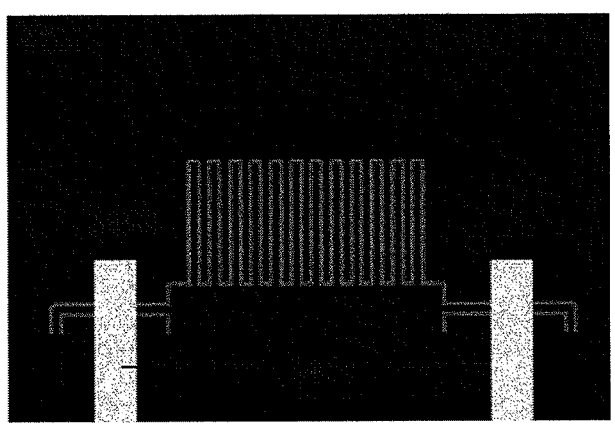
Figure 34D:
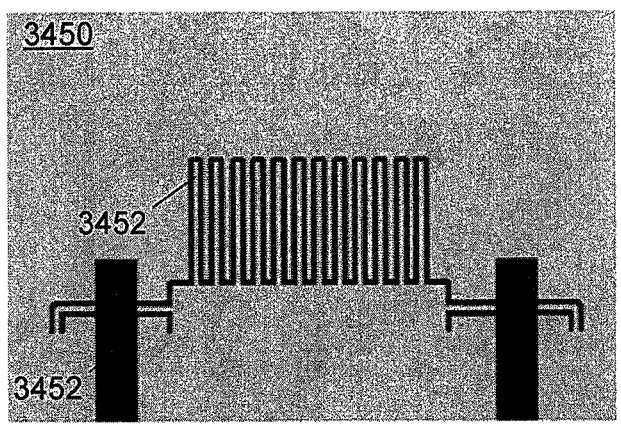

Alternatively, in other embodiments, device 3470 may be fabricated using the steps shown in FIGS. 34C and 34D. In one respect, referring to step 3400A, an initial pattern is established, where first layer 3452, second layer 3454, and third layer 3458 may be deposited on substrate 3450 (not shown). In some embodiments, first layer 3452 and third layer 3458 may include the same material. Next, third material 3458 may be patterned using techniques of known in the art. For example, in one respect, a photoresist layer may be deposited on third layer 3458 and patterned. An etching technique, selective to second layer 3454 may be used to etch and pattern second layer 3854 and the photoresist layer may subsequently be removed.

In step 3402A, a fourth layer 3460 (e.g., a spacer layer) may be deposited on the resultant structure of step 3400 and subsequently patterned using techniques known in the art. Subsequently, third material 3458 may be removed.

Still referring to step 3402A, a clipping pattern may be defined. In one respect, fifth layer 3462 may be deposited on the structure after third material 3458 has been removed. Fifth layer 3452 may be patterned with optical lithography, and may define a clipping pattern.

Using the clipping pattern as a masking layer (e.g., using patterned fifth layer 3462 as a masking layer), portions of fourth layer 3460 may be removed using techniques known in the art. In particular, portions of fourth layer 3460 not protected by fifth layer 3462 may be etched away.

In step 3406A, sixth layer 3464 may be deposited on the resultant structure of step 3404A, and may be patterned as shown in step 3408A. In one respect, sixth layer 3464 may be patterned with optical lithography. For example, 193 nm lithography, 248 nm lithography, or e-beam lithography may be used to pattern the layers. One of ordinary skill in the art would recognize that the resolution needed, and thus, the type of optical lithography used may depend on the details of the pattern. Therefore, other optical lithography techniques may be used to pattern the layers of present disclosure.

The pattern formed from step 3406A may be used to pattern second layer 3454. In one respect, an etchant selective to first layer 3452 may be used to etch second layer 3454. The resultant structure is shown in step 3408A.

Next, a seventh layer (e.g., a second spacer layer) may be deposited on the resultant structure shown in step 3408A. In particular, referring to step 3410A, seventh layer 3466 may be deposited and may be etched using techniques know in the art. Second layer 3454 may subsequently be removed, and the resultant structure is shown in step 3410A.

In step 3412A, shown in FIG. 34D, eighth layer 3468 may be deposited on the structure shown in FIG. 3410. Eighth layer 3468 may be patterned and may be define a clipping area. Using the patterned eighth layer 3468 as a masking layer, portions of seventh layer 3466 may be etched using an etchant selective to layer second 3452. A ninth layer, layer 3470 may be deposited after portions of layer 3466 are removed. Eighth layer 348 may subsequently be removed. Next, using, for example, optical lithography, ninth layer 3470 may be patterned to define pads, as shown in step 3414A.

In step 3416A, the resultant pattern of step 3414A may be used as a mask to etch portions of first layer 3452. In other words, the resultant structure shown 3416A may be transferred to first layer 3452 using techniques such as dry or wet etching to form the device 3470.

Figure 35A:
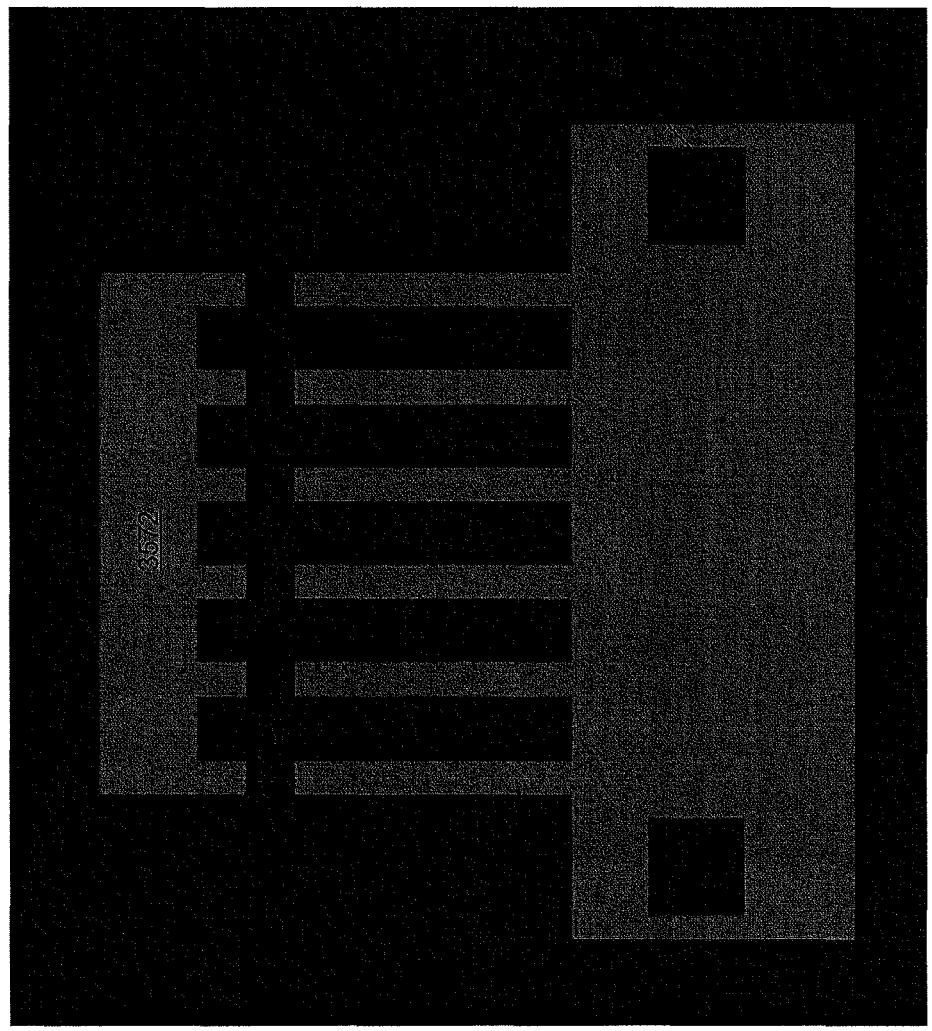
FIG. 35A is an initial pattern used for fabricating a testable pitch-quadrupled comb, in accordance with embodiments of the present disclosure.
Figure 35B:
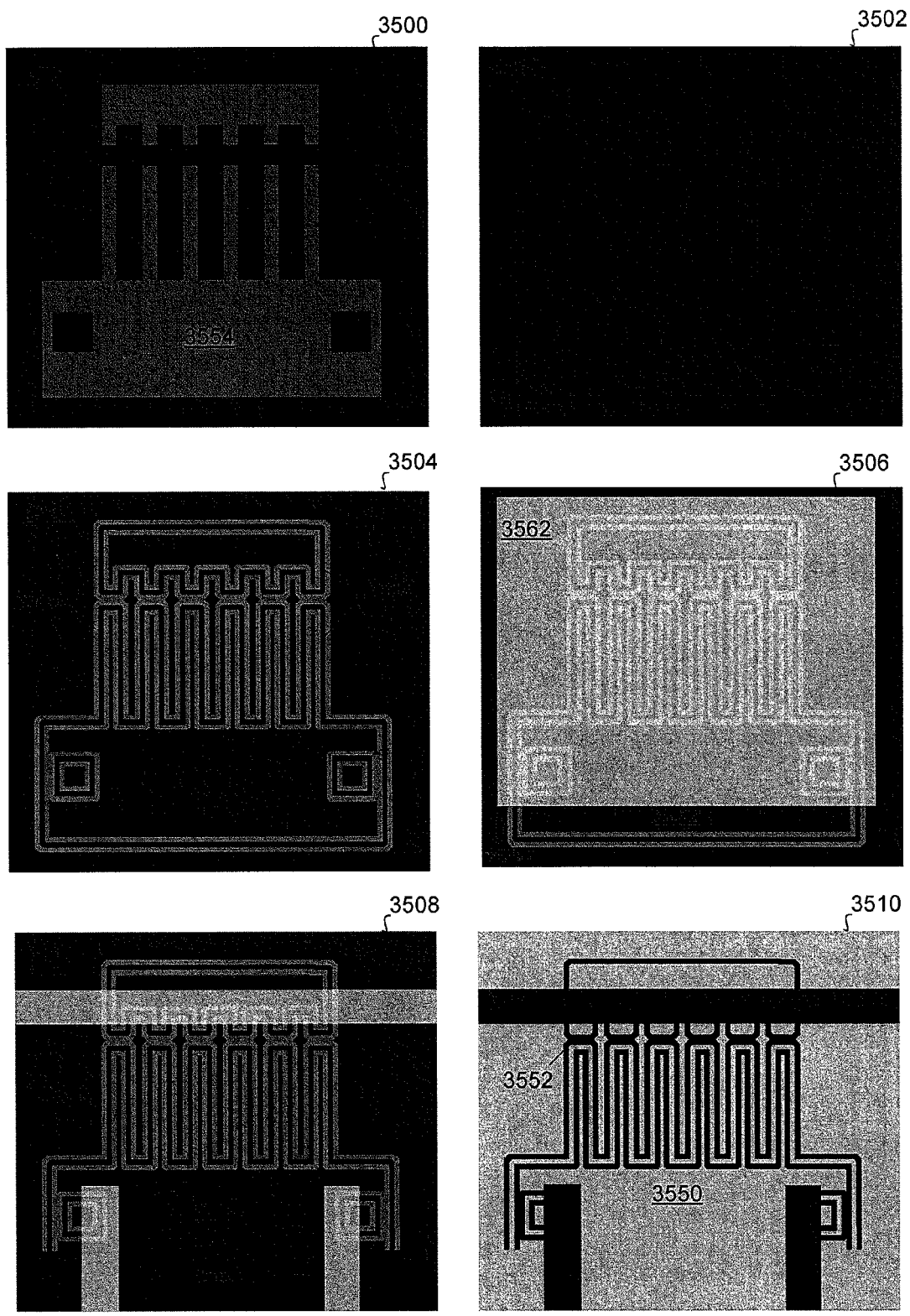
FIG. 35B are steps for fabricating testable pitch-quadrupled serpentine of FIG. 35A, in accordance with embodiments of the present disclosure.

Similarly, the steps shown in FIGS. 1-9 may be applied to the fabrication of electrically testable pitch-quadrupled comb structure shown in step 3510 shown of FIG. 35B. Referring to FIG. 35A, the initial pattern 3570 shown is one example of many different approaches, and one of ordinary skill in the art would recognize that combs of different pitches may also be fabricated. Device 3570 includes tines 3572 which define the pitch. The pitch pictured may be quadrupled by the spacer process of the techniques of the present disclosure. Generally, the trench width ($T_w$) is critical, and needs to be less than about 4 times the size of the second spacer line width. The line width ($L_w$), which allows for electrical connection to the inner loop, is also critical. In one respect, the line width may be less than the quarter pitch.

Referring to FIG. 35B, steps for fabricating a comb structure are shown. In step 3500 (showing a top view of the resultant structure) an initial pattern is established, where first layer 3552 and second layer 3554 may be deposited on substrate 3550 (not shown). Second layer 3554 may be patterned using various techniques known in the art. For example, in one respect, a photoresist layer may be deposited and patterned on 3554. An etching technique, selective to first layer 3552 may be used to etch and pattern second layer 3554 and the photoresist layer may be subsequently removed.

In step 3502, third layer 3558 (e.g., a first spacer material) may be deposited on the resultant structure shown in step 3500. Next, an etching technique (e.g., wet or dry etch) may be used to etch back third layer 3458. Second layer 3552 may subsequently be removed.

In step 3504, a fourth layer 3560 (e.g., a second spacer material) may be deposited. In particular, fourth layer 3560 may be deposited and may be subsequently patterned. In step 3506, third material 3558 may be removed using techniques known in the art. A fifth layer 3562 may be deposited and patterned to form a clipping layer. Techniques for depositing and patterning layer 3562 are known in the art.

Next, third layer 3558 may be etched. In some embodiments, a portion of third layer 3558, and more particularly, portions of third layer not protected by clipping layer 3562 may be etched away. Clipping layer 3562 may subsequently be removed using techniques shown in the art. The resultant structure is shown in step 3508.

Also shown in step 3508, a sixth layer 3564 may be deposited and subsequently patterned to create tabs using techniques known in the art (e.g., optical lithography). The resultant pattern of step 3508 may be used as a mask to etch portions of first layer 3552, as shown in step 3510. In other words, the resultant structure shown 3508 may be transferred to first layer 3552 using techniques such as dry or wet etching to form the device 3570.

All of the methods disclosed and claimed can be made and executed without undue experimentation in light of the present disclosure. While the methods of this invention have been described in terms of embodiments, it will be apparent to those of skill in the art that variations may be applied to the methods and in the steps or in the sequence of steps of the method described herein without departing from the concept, spirit and scope of the invention. All such similar substitutes and modifications apparent to those skilled in the art are deemed to be within the spirit, scope, and concept of the disclosure as defined by the appended claims.

The invention claimed is:

1. A method for fabricating a corrugated structure in a semiconductor surface, comprising:
   providing a first semiconductor layer;
   providing a second semiconductor layer on the first semiconductor layer, where the second semiconductor layer comprises a semiconductor substrate;
   forming a plurality of line structures in the first semiconductor layer comprising:
      depositing a third semiconductor layer on the first semiconductor layer;
      etching the third semiconductor layer to create a plurality of line structures in the third semiconductor layer;
      depositing a fourth semiconductor layer on the plurality of line structures in the etched third semiconductor layer
      etching the fourth semiconductor layer to create a plurality of line structure in the fourth semiconductor layer;
      removing the plurality of line structures in the third semiconductor layer;
      depositing a fifth semiconductor layer on the plurality of line structures in the etched fourth semiconductor layer;
      etching the semiconductor fifth layer to create a plurality of line structures in the fifth semiconductor layer;
      removing the plurality of line structures in the fourth semiconductor layer; and
      using the plurality of line structures in the fifth semiconductor layer as a mask to etch first layer to form a plurality of line structures in the first semiconductor layer;
   using the plurality of line structure as a mask to etch the surface of the second semiconductor layer; and
   annealing the etched second semiconductor layer in a hydrogen atmosphere to form the corrugated surface in the second semiconductor layer.

* * * * *